US012604453B2

(12) United States Patent
Hua et al.

(10) Patent No.: US 12,604,453 B2
(45) Date of Patent: Apr. 14, 2026

(54) SEMICONDUCTOR STRUCTURE AND METHOD FOR FORMING SEMICONDUCTOR STRUCTURE

(71) Applicant: ICLEAGUE TECHNOLOGY CO., LTD., Jiaxing (CN)

(72) Inventors: Wenyu Hua, Jiaxing (CN); Boyong He, Jiaxing (CN)

(73) Assignee: ICLEAGUE TECHNOLOGY CO., LTD., Jiaxing (CN)

( * ) Notice: Subject to any disclaimer, the term of this patent is extended or adjusted under 35 U.S.C. 154(b) by 427 days.

(21) Appl. No.: 18/554,367

(22) PCT Filed: Aug. 30, 2021

(86) PCT No.: PCT/CN2021/115297
§ 371 (c)(1),
(2) Date: Oct. 6, 2023

(87) PCT Pub. No.: WO2022/213530
PCT Pub. Date: Oct. 13, 2022

(65) Prior Publication Data
US 2024/0196588 A1 Jun. 13, 2024

(30) Foreign Application Priority Data

Apr. 7, 2021 (CN) .......................... 202110373396.4
Apr. 7, 2021 (CN) .......................... 202110374507.3

(51) Int. Cl.
*H10B 12/00* (2023.01)
(52) U.S. Cl.
CPC ....... *H10B 12/0335* (2023.02); *H10B 12/053* (2023.02); *H10B 12/315* (2023.02);
(Continued)

(58) Field of Classification Search
None
See application file for complete search history.

(56) References Cited

U.S. PATENT DOCUMENTS 7,732,849 B2 * 6/2010 Liu ...................... H10B 12/395
257/302
9,356,073 B1 5/2016 Kim
(Continued)

FOREIGN PATENT DOCUMENTS

| CN | 109192728 A | 1/2019 |
| CN | 112071841 A | 12/2020 |
| CN | 112447602 A | 3/2021 |

OTHER PUBLICATIONS

International Search Report for PCT/CN2021/115297 mailed Jan. 13, 2022, ISA/CN.

*Primary Examiner* — Bradley Smith
(74) *Attorney, Agent, or Firm* — Yue (Robert) Xu; Apex Attorneys at Law, LLP

(57) ABSTRACT
A semiconductor structure and a method for forming the semiconductor structure are provided. The semiconductor structure includes: a substrate including a first surface and a second surface, which includes a plurality of active areas arranged along a first direction and in parallel along a second direction; a plurality of first recesses arranged in the substrate; a word line gate structure disposed in a first recess, which includes a first side wall and a second side wall, wherein the second side wall is adjacent to an active area; a first isolation structure disposed in the first recess and disposed between the word line gate structure and an active area; a plurality of capacitor structures disposed on the first surface and electrically coupled with an active area; and a plurality of bit lines disposed on the second surface, which are arranged along the first direction and parallel to the second direction.

21 Claims, 17 Drawing Sheets

(52) U.S. Cl.
CPC ........... *H10B 12/34* (2023.02); *H10B 12/482* (2023.02); *H10B 12/488* (2023.02)

(56)                 References Cited

U.S. PATENT DOCUMENTS

| 9,972,626 B1 * | 5/2018 | Takesako | ............... | H10B 12/34 |
| 10,074,654 B1 | 9/2018 | Takesako | | |
| 2024/0114674 A1 * | 4/2024 | Na | ........................ | H10B 12/315 |

* cited by examiner

SEMICONDUCTOR STRUCTURE AND METHOD FOR FORMING SEMICONDUCTOR STRUCTURE

CROSS-REFERENCE TO RELATED APPLICATIONS

This application is a National Stage of International Application No. PCT/CN2021/115297, filed on Aug. 30, 2021, which claims the benefit of priority to Chinese Patent Application No. 202110373396.4, filed on Apr. 7, 2021, and entitled "SEMICONDUCTOR STRUCTURE", and to Chinese Patent Application No. 202110374507.3, filed on Apr. 7, 2021, and entitled "METHOD FOR FORMING SEMICONDUCTOR STRUCTURE", the contents of which are incorporated herein by reference in their entireties.

TECHNICAL FIELD

The present disclosure relates to the field of semiconductor manufacturing, and more particularly, to a semiconductor structure and a method for forming the semiconductor structure.

BACKGROUND

Dynamic random access memory (DRAM) is a type of semiconductor memory which use the amount of charges stored in a capacitor memory to represent a binary bit being 1 or 0.

Typically, a basic storage unit of dynamic random access memory (DRAM) consists of a transistor and a storage capacitor, while a storage array is generally composed of multiple storage units. Therefore, the memory chip's area is influenced by the size of the basic storage unit.

Existing Random Access Memory still needs to be improved.

SUMMARY

The present disclosure provides a semiconductor structure and a method for forming a semiconductor structure to improve performances of a dynamic random access memory.

Embodiments of the present disclosure provide a method for forming a semiconductor structure. The method includes: providing a substrate including a first surface and a second surface opposite to the first surface, wherein the substrate includes a plurality of active areas separated from each other and arranged along a first direction, the active areas are disposed in parallel along a second direction, and the first direction is disposed perpendicular to the second direction; forming a plurality of first recesses in the substrate, wherein the first recesses stretch from the first surface to the second surface, and the first recesses are arranged along the second direction and run through an active area along the first direction; forming an initial word line gate structure in a first recess, wherein the initial word line gate structure includes a first side wall and a second side wall opposite to the first side wall, and the first side wall and the second side wall are respectively adjacent to the active area; removing the first side wall and a part of the active area adjacent to the first side wall to form a word line gate structure and to form a second recess between the word line gate structure and the active area; forming a first isolation structure in the second recess; forming a plurality of capacitor structures on the first surface of the substrate, wherein each of the capacitor structures is electrically coupled with an active area adjacent to the second recess; and forming a plurality of bit lines on the second surface of the substrate, wherein the bit lines are arranged along the first direction and parallel to the second direction.

According to some embodiments, the word line gate structure includes: a gate dielectric layer disposed on a side wall and a bottom surface of the first recess, and a gate layer disposed on the gate dielectric layer.

According to some embodiments, a depth of the first isolation structure is greater than or equal to a depth of the word line gate structure.

According to some embodiments, the gate layer is made of a material selected from a group consisting of polycrystalline silicon and a metal, and the metal includes tungsten.

According to some embodiments, the gate layer includes a first part disposed on a bottom of the first recess and a second part disposed on the first part, and the first part and the second part are different in materials.

According to some embodiments, the first part is made of a material selected from a group consisting of polycrystalline silicon and a metal, and the metal includes tungsten; and the second part is made of a material selected from a group consisting of polycrystalline silicon and a metal, and the metal includes tungsten.

According to some embodiments, a second isolation structure is disposed between adjacent active areas, and forming the bit lines includes: thinning the substrate from the second surface until the second isolation structure is exposed; performing an ion implantation into the active areas exposed from the second surface of the substrate after thinning to form a plurality of second doped regions in the active areas; and forming the bit lines on the second doped regions, wherein each of the bit lines is electrically coupled with the second doped regions arranged in a row along the second direction.

According to some embodiments, a depth of a second doped region is greater than or equal to a spacing between the word line gate structure and the second surface of the substrate.

According to some embodiments, the method further includes: before forming the bit lines on the second doped regions, forming a plurality of bit line plugs on the second doped regions, wherein a bit line plug is electrically coupled with a bit line and a second doped region.

According to some embodiments, the method further includes: after performing an ion implantation into the active areas exposed from the second surface of the substrate after thinning and before forming the bit lines on the second doped regions, removing a part of an active area at a bottom of the word line gate structure until the gate dielectric layer is exposed, forming a fifth recess in each active area, and forming the second doped regions separated from each other in the active areas exposed from the second surface of the substrate.

According to some embodiments, the forming the bit lines includes: forming a first dielectric layer on an active area exposed from the second surface of the substrate and on the second isolation structure, wherein a plurality of third recesses are formed in the first dielectric layer, and active areas are exposed from the third recesses; and forming the bit lines in the third recesses.

According to some embodiments, a bit line includes: a barrier layer disposed on a side wall and a bottom surface of a third recess, and a bit line layer disposed on the barrier layer.

According to some embodiments, forming a capacitor structure includes: forming a second dielectric layer on the first isolation structure and on an active area exposed from the first surface of the substrate; forming a fourth recess in the second dielectric layer, wherein a part of the active area is exposed from the fourth recess; and forming a capacitor structure in the fourth recess.

According to some embodiments, thinning the substrate from the second surface includes: providing a base, wherein a surface of the base is bonded with the second dielectric layer; and turning the base and the substrate over and thinning the substrate from the second surface.

According to some embodiments, thinning the substrate from the second surface includes a chemical mechanical polishing process.

According to some embodiments, the method further includes: after forming the initial word line gate structure and before removing the first side wall and the part of the active area adjacent to the first side wall, performing an ion implantation into an active area exposed from the first surface of the substrate to form a first doped region in the active area, wherein a capacitor structure is electrically coupled with the first doped region.

According to some embodiments, a projection of the capacitor structure on the first surface of the substrate coincides with at least a part of the first doped region.

According to some embodiments, the method further includes: after forming the first isolation structure and before forming the capacitor structure on the active area, forming a capacitor plug on the first doped region, wherein the capacitor plug is electrically coupled with the capacitor structure and the first doped region.

According to some embodiments, a top surface of the word line gate structure facing the first surface of the substrate is higher than a bottom surface of the first doped region facing the first surface of the substrate.

According to some embodiments, the removing the first side wall and the part of the active area includes a dry etching process.

According to some embodiments, each of the capacitor structures is disposed on an active area adjacent to the second side wall.

Embodiments of the present disclosure provide a semiconductor structure. The semiconductor structure includes: a substrate including a first surface and a second surface opposite to the first surface, wherein the substrate includes a plurality of active areas separated from each other and arranged along a first direction, the active areas are disposed in parallel along a second direction, and the first direction is disposed perpendicular to the second direction; a plurality of first recesses in the substrate, wherein the first recesses stretch from the first surface to the second surface, and the first recesses are arranged along the second direction and run through an active area along the first direction; a word line gate structure disposed in a first recess, wherein the word line gate structure includes a first side wall and a second side wall opposite to the first side wall, and the second side wall is adjacent to an active area; a first isolation structure disposed in the first recess, wherein the first isolation structure is adjacent to the first side wall of the word line gate structure, and the first isolation structure is disposed between the word line gate structure and an active area, and also disposed in a part of an active area; a plurality of capacitor structures disposed on the first surface of the substrate, wherein each of the capacitor structures is electrically coupled with an active area; and a plurality of bit lines disposed on the second surface of the substrate, wherein the bit lines are arranged along the first direction and parallel to the second direction.

According to some embodiments, the word line gate structure includes: a gate dielectric layer disposed on a side wall and a bottom surface of the first recess, and a gate layer disposed on the gate dielectric layer.

According to some embodiments, a depth of the first isolation structure is greater than or equal to a depth of the word line gate structure.

According to some embodiments, the gate layer is made of a material selected from a group consisting of polycrystalline silicon and a metal, and the metal includes tungsten.

According to some embodiments, the gate layer includes a first part disposed on a bottom of the first recess and a second part disposed on the first part, and the first part and the second part are different in materials.

According to some embodiments, the first part is made of a material selected from a group consisting of polycrystalline silicon and a metal, and the metal includes tungsten; and the second part is made of a material selected from a group consisting of polycrystalline silicon and a metal, and the metal includes tungsten.

According to some embodiments, a bottom surface of the gate dielectric layer is also exposed from the second surface of the substrate.

According to some embodiments, the semiconductor structure also includes: a first doped region in an active area exposed on from the first surface of the substrate, wherein each of the capacitor structures is respectively electrically coupled with the first doped region.

According to some embodiments, a projection of a capacitor structure on the first surface of the substrate coincides with at least a part of the first doped region.

According to some embodiments, the semiconductor structure also includes: a plurality of capacitor plugs disposed between the capacitor structures and the first doped region, wherein a capacitor plug is electrically coupled with a capacitor structure and the first doped region.

According to some embodiments, a top surface of the word line gate structure facing the first surface of the substrate is higher than a bottom surface of the first doped region facing the first surface of the substrate.

According to some embodiments, the semiconductor structure also includes: a plurality of second doped regions in the active areas exposed from the second surface of the substrate, wherein each of the bit lines is electrically coupled with the second doped regions arranged in a row along the second direction.

According to some embodiments, a depth of a second doped region is greater than or equal to a spacing between the word line gate structure and the second surface of the substrate.

According to some embodiments, the semiconductor structure also includes: a plurality of bit line plugs, wherein a bit line plug is disposed between a bit line and a second doped region, and the bit line plug is electrically coupled with a bit line and a second doped region.

According to some embodiments, a second isolation structure is disposed between adjacent active areas, and the second isolation structure is exposed from the second surface of the substrate.

According to some embodiments, the semiconductor structure also includes: a first dielectric layer disposed on the second surface of the substrate and on the second isolation structure, wherein a plurality of third recesses are formed in the first dielectric layer, an active area is exposed from a third recess, and a bit line is disposed in the third recess.

According to some embodiments, the bit line includes: a barrier layer disposed on a side wall and a bottom surface of the third recess, and a bit line layer disposed on the barrier layer.

According to some embodiments, the second isolation structure is made of a material including a dielectric material, and the dielectric material includes silicon oxide.

According to some embodiments, the first isolation structure is made of a material including a dielectric material, and the dielectric material includes silicon oxide.

According to some embodiments, the semiconductor structure also includes: a second dielectric layer disposed on the first isolation structure and on an active area exposed from the first surface of the substrate, wherein a capacitor structure is disposed in the second dielectric layer.

According to some embodiments, each of the capacitor structures is disposed on an active area adjacent to the second side wall.

Compared with the conventional technology, the present disclosure has the following beneficial effects.

According to the semiconductor structure in some embodiments of the present disclosure, in an aspect, the bit line is disposed on the second surface of the substrate, and the capacitor structure is disposed on the first surface of the substrate, which could greatly reduce the difficulty and cost of the manufacturing process. In another aspect, the word line gate structure is disposed in the substrate, and a channel controlled by the word line gate structure is perpendicular to a surface of the substrate, thereby reducing the area of the substrate in the horizontal direction, which is conductive to increasing the density of storage array units. In yet another aspect, a first isolation structure is disposed between the word line gate structure and the active area, the second side wall of the word line gate structure is adjacent to the active area, and the first side wall of the word line gate structure is adjacent to the first isolation structure, which makes the active area and the first side wall of the word line gate structure isolated by the first isolation structure, avoiding parasitic devices with two channels produced when the word line gate structure contacts with both adjacent active areas, and makes it easier to turn off the transistor. Therefore, leakage current can be reduced and performances of the semiconductor structure can be improved.

Furthermore, the first doped region and the second doped region are formed respectively on two surfaces of the substrate, thereby saving the area of the substrate in the horizontal direction, which is conductive to increasing the density of storage array units.

Furthermore, the gate layer includes a first part and a second part on the first part. The first part is made of a material selected from a group consisting of polycrystalline silicon and a metal, and the metal includes tungsten. The second part is made of a material selected from a group consisting of polycrystalline silicon and a metal, and the metal includes tungsten. The materials of the gate layer are not all made of polycrystalline silicon or metal, which improves resistance performances of the gate layer and reduces leakage current of the gate layer.

Furthermore, the semiconductor structure also includes a plurality of capacitor plugs disposed between the capacitor structures and the first doped region, a capacitor structure is electrically coupled with the first doped region through a capacitor plug. Therefore, a process window for forming the capacitor structure and the capacitor plug can be enlarged.

Furthermore, a bottom surface of the gate dielectric layer is exposed from the second surface of the substrate. The active areas on the second surface of the substrate are separated from each other, thereby reducing the capacitance after forming a bit line on the active areas on the second surface of the substrate.

DETAILED DESCRIPTION

As mentioned in the background, the conventional dynamic random access memory still needs to be improved. Analysis and explanation are provided in conjunction with examples.

Figures 1, 2:
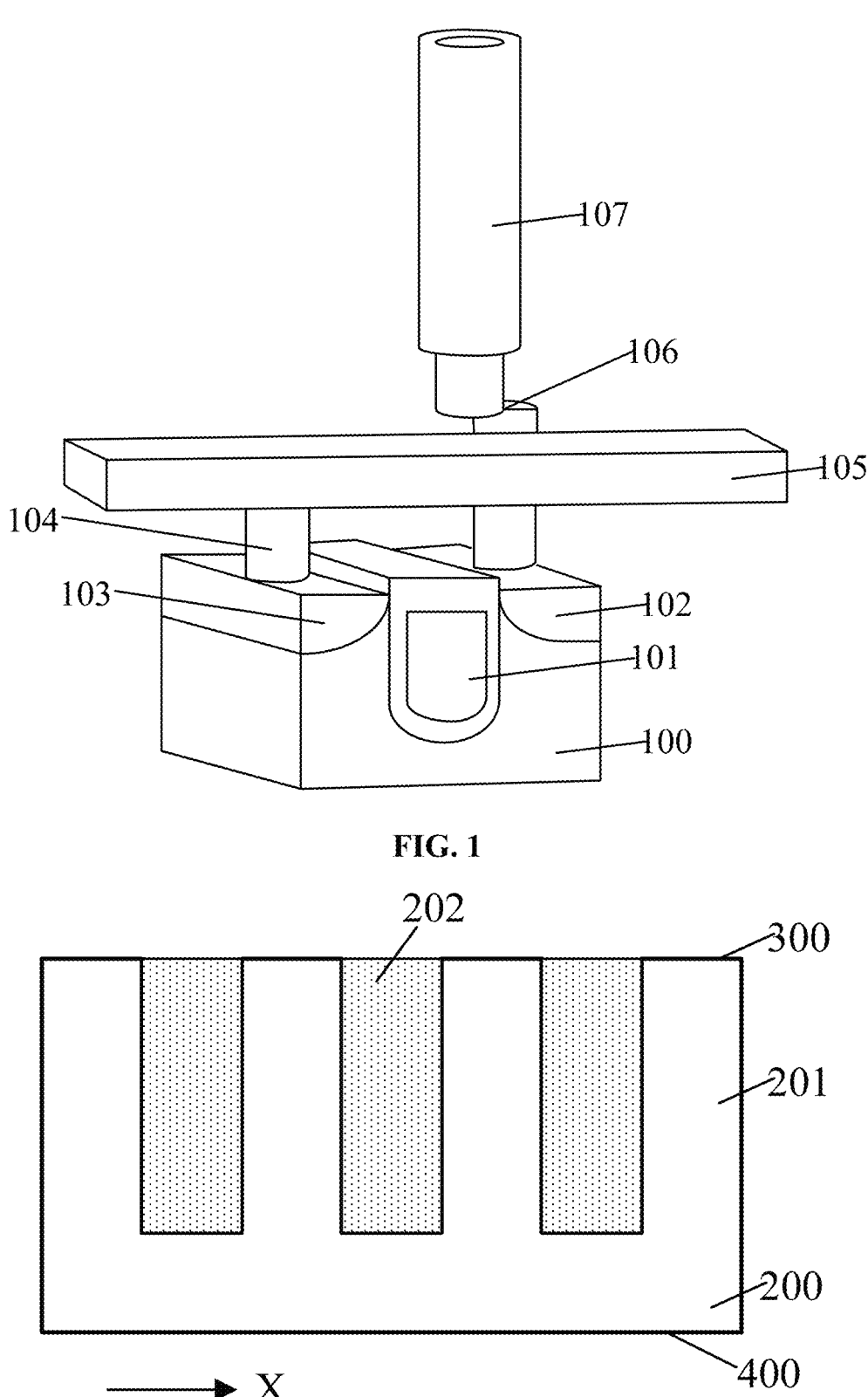
FIG. 1 schematically illustrates a structural diagram of a semiconductor structure according to an example.
FIG. 2 to FIG. 24 schematically illustrate diagrams of an intermediate semiconductor structure according to an embodiment of the present disclosure.

FIG. 1 schematically illustrates a structural diagram of a semiconductor structure according to an example.

Referring to FIG. 1, the semiconductor structure includes: a substrate 100; a word line gate structure 101 disposed in the substrate 100; a source doped region 103 and a drain doped region 102 disposed in the substrate 100 on both sides of the word line gate structure 101; a bit line 105 electrically coupled with the source doped region 103 through a source plug 104; and a capacitor structure 107 electrically coupled with the drain doped region 102 through a capacitor plug 106.

A process for forming the semiconductor structure is as follows: firstly, forming the source doped region 103 and the drain doped region 102, then forming the word line gate structure 101 in the substrate 100, then forming the source plug 104 and the bit line 105, then forming the capacitor plug 106, and finally forming the capacitor structure 107. The channel of the semiconductor structure is U-shaped, and the source doped region 103 and drain doped region 102 are disposed on both horizontal sides of the word line gate structure 101. The bit line 105 and the capacitor structure 107 are disposed on the same side of the transistor, and manufacturing processes are conducted on the substrate. The capacitor plug 106 of the capacitor structure 107 needs to pass through the bit line 105, resulting in a high overall process complexity and high requirements for photo lithography process and alignment.

For solving the problems above, a new semiconductor structure is provided according to some embodiments of the present disclosure. On one hand, the bit line is disposed on the second surface of the substrate, and the capacitor structure is disposed on the first surface of the substrate, which could greatly reduce the difficulty and cost of the manufacturing process. On the other hand, the word line gate structure is disposed in the substrate, thereby saving a space in the direction perpendicular to the substrate surface and being conductive to increasing the density of storage array units. On another hand, a first isolation structure is disposed between the word line gate structure and the active area, the second side wall of the word line gate structure is adjacent to the active area, and the first side wall of the word line gate structure is adjacent to the first isolation structure, which makes the active area and the first side wall of the word line gate structure isolated by the first isolation structure, avoiding parasitic devices with two channels produced when the word line gate structure contacts with both adjacent active areas, and makes it easier to turn off the transistor. Therefore, leakage current can be reduced and performances of the semiconductor structure can be improved.

In order to make the aforementioned purposes, features and beneficial effects of the present disclosure clearer and easier to understand, the embodiments of the present disclosure are described in detail below with reference to the accompanying drawings.

FIG. 2 to FIG. 24 schematically illustrate diagrams of an intermediate semiconductor structure according to an embodiment of the present disclosure.

Figures 3, 4:
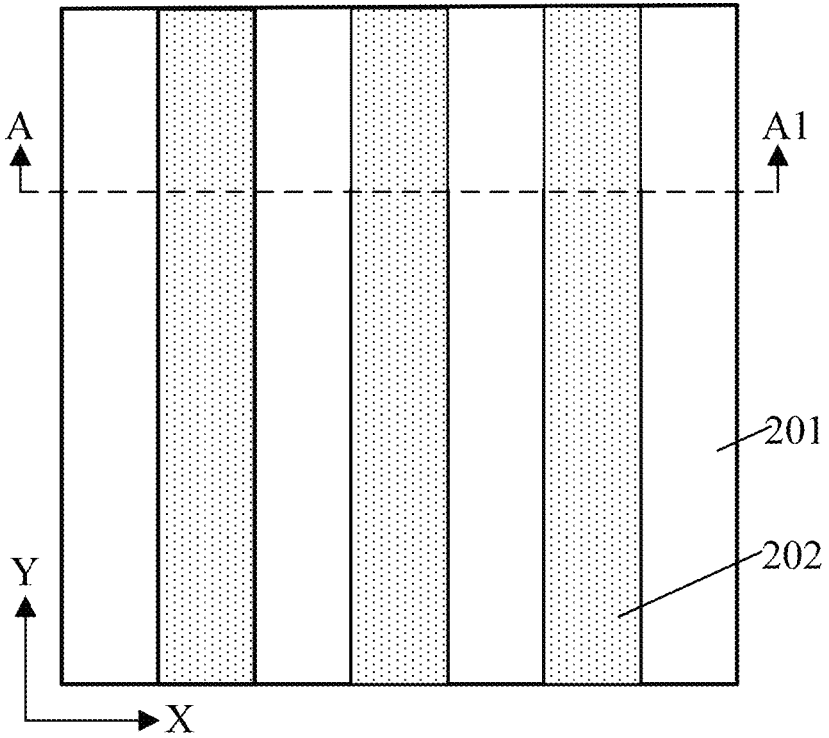

Referring to FIG. 2 and FIG. 3, FIG. 3 is a top view of the first surface 300 of the substrate in FIG. 2. FIG. 2 schematically illustrates a cross-sectional structural diagram along the section line AA1 in FIG. 3. A substrate 200 is provided. The substrate includes a first surface 300 and a second surface 400 opposite to the first surface 300. The substrate 200 includes a plurality of active areas 201 separated from each other and arranged along a first direction X, and the active areas 201 are disposed in parallel along a second direction Y. The first direction X and the second direction Y are perpendicular to each other.

According to some embodiments, the substrate 200 is made of silicon.

According to some embodiments, the substrate is made of a material including: silicon carbide, silicon germanium, multi-component semiconductor materials composed of III-V group elements, silicon on insulator (SOI) or germanium on insulator (GOI). Multi-component semiconductor materials composed of III-V group elements may include InP, GaAs, GaP, InAs, InSb, InGaAs or InGaAsP.

According to some embodiments, a second isolation structure 202 is disposed between adjacent active areas 201.

The second isolation structure 202 is made of a material including a dielectric material. The dielectric material may include one or more selected from a group consisting of: silicon oxide, silicon nitride, silicon carbide, silicon oxycarbide, silicon oxynitride, aluminum oxide, aluminum nitride, silicon carbide nitride and silicon oxycarbide nitride.

According to some embodiments, the second isolation structure 202 is made of a material including silicon oxide.

Figure 5:
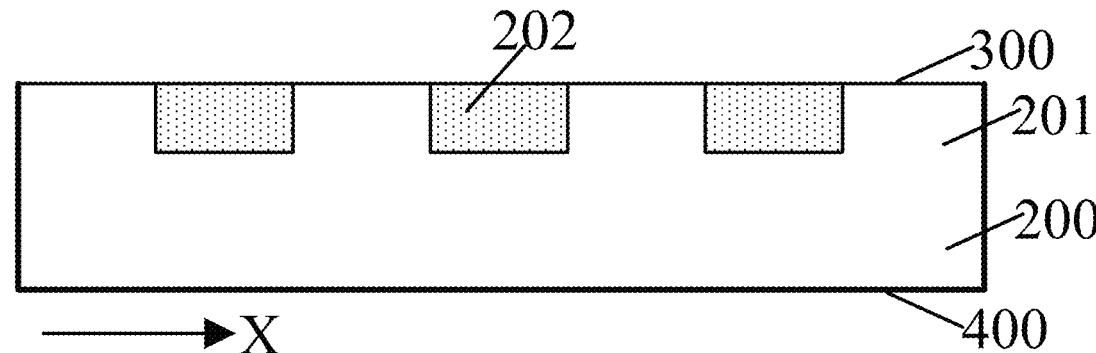
Figure 6:
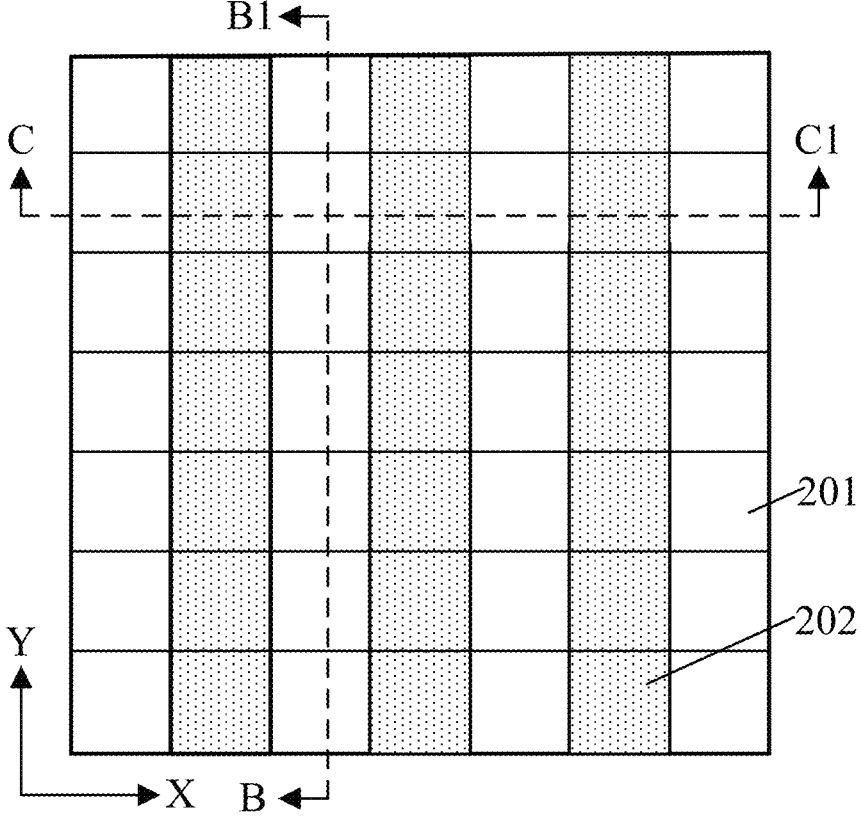

Referring to FIG. 4, FIG. 5 and FIG. 6, FIG. 6 is a top view of the first surface 300 of the substrate in FIG. 4 and FIG. 5. FIG. 4 schematically illustrates a cross-sectional structural diagram along the section line BB1 in FIG. 6. FIG. 5 schematically illustrates a cross-sectional structural diagram along the section line CC1 in FIG. 6. A plurality of first recesses 203 are formed in the substrate 200. The first recesses 203 stretch from the first surface 300 to the second surface 400. The first recesses 203 are arranged along the second direction Y, and run through an active area 201 along the first direction X.

A method for forming a first recess 203 includes: forming a patterned mask layer (not shown) on the first surface 300 of the substrate, wherein a part of the active area 201 is exposed from the patterned mask layer; and etching the active area 201 with the patterned mask layer serving as a mask to form the first recess 203 in the substrate.

According to some embodiments, a bottom surface of the first recess 203 facing the second surface 400 of the substrate is higher than a bottom surface of the second isolation structure 202 facing the second surface 400 of the substrate. A physical space is kept for subsequently forming the second doped region on the second surface 400 of the substrate.

Figure 7:
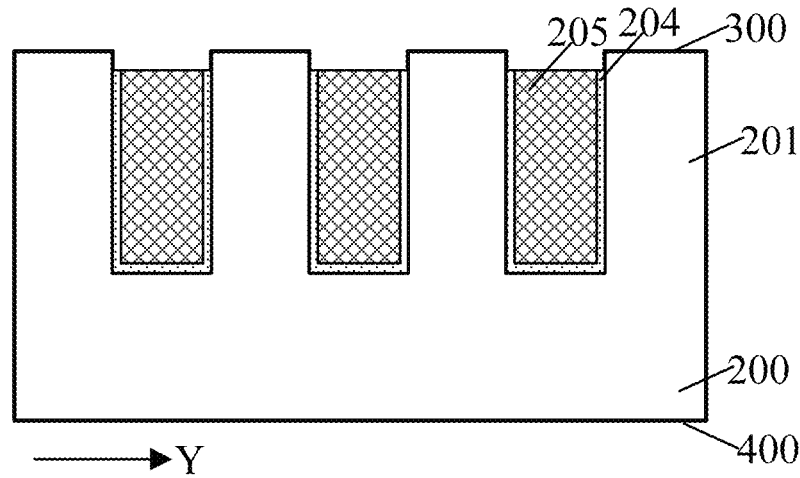
Figure 8:
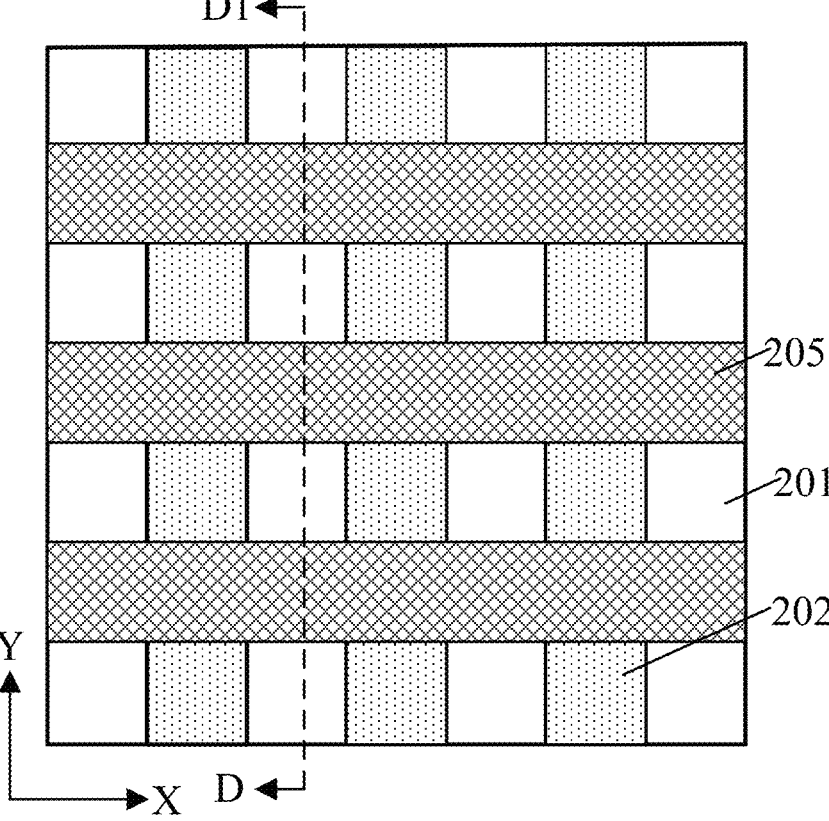

Referring to FIG. 7 and FIG. 8, FIG. 8 is a top view of the first surface 300 of the substrate in FIG. 7. FIG. 7 schematically illustrates a cross-sectional structural diagram along the section line DD1 in FIG. 8. An initial word line gate structure is formed in the first recess 203. The initial word line gate structure includes a first side wall (not shown) and a second side wall (not shown) opposite to the first side wall. The first side wall and the second side wall are adjacent to the active area 201 respectively.

The initial word line gate structure includes: an initial gate dielectric layer 204 disposed on a side wall and a bottom surface of the first recess 203, and an initial gate layer 205 on the initial gate dielectric layer 204.

A top surface of the initial word line gate structure facing the first surface 300 of the substrate is lower than the first surface 300 of the substrate, thus, a physical space is left for subsequently forming a first doped region in the active area 201 exposed from the first surface 300.

A method for forming the initial word line gate structure includes: forming a gate dielectric material layer (not shown) on the side wall and the bottom surface of the first recess 203, and on the active area 201 exposed from the first surface 300 of the substrate; forming a gate material layer (not shown) on the gate dielectric material layer; planarizing the gate material layer and gate dielectric material layer until the surface of the active area 201 is exposed to form a transitional initial word line gate structure; and etching back the transitional initial word line gate structure until a part of a side wall of the first recess 203 is exposed to form the initial word line gate structure.

According to some embodiments, the initial gate dielectric layer 204 is made of a material including silicon oxide or a low K material (K is less than 3.9), and the initial gate layer 205 is made of a material including polycrystalline silicon.

According to some embodiments, the initial gate dielectric layer is made of a material including a high dielectric constant material, the dielectric constant (K) of the high dielectric constant material is greater than 3.9, and the high dielectric constant material includes alumina oxide or hafnium oxide. The initial gate layer is made of a material including a metal, and the metal includes tungsten.

According to some embodiments, the initial word line gate structure also includes an initial work function layer disposed between the initial gate dielectric layer and the initial gate layer. The initial work function layer is made of a material including a N-type work function material or a P-type work function material, the N-type work function material includes titanium aluminum, and the P-type work function material includes titanium nitride or tantalum nitride.

According to some embodiments, the initial gate layer includes a first part disposed on a bottom of the first recess and a second part disposed on the first part. The first part and the second part are different in materials.

Figure 9:
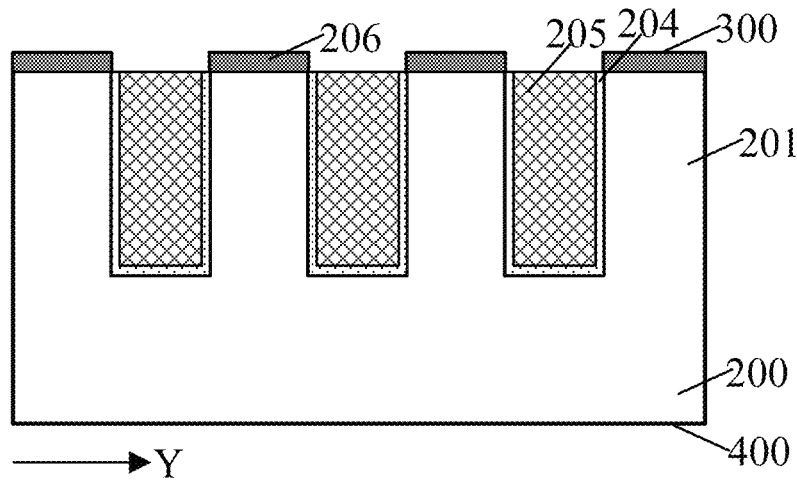
Figure 10:
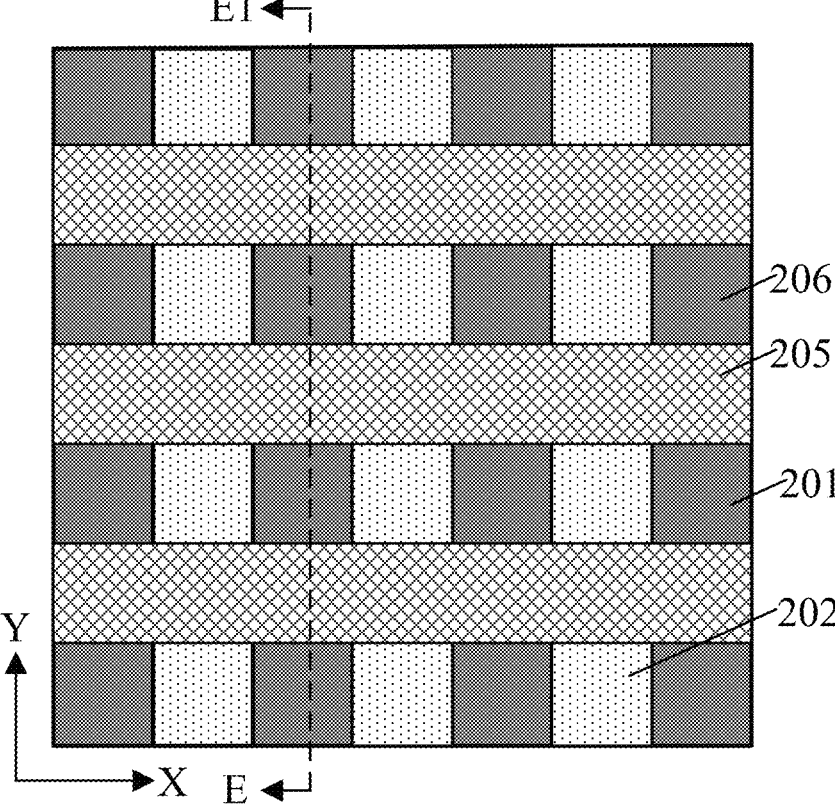

Referring to FIG. 9 and FIG. 10, FIG. 10 is a top view of the first surface 300 of the substrate in FIG. 9. FIG. 9 schematically illustrates a cross-sectional structural diagram along the section line EE1 in FIG. 10. After the initial word line gate structure is formed, an ion implantation is performed into the active area 201 exposed from the first surface 300 of the substrate 200 to form a first doped region 206 in the active area 201.

A top surface of the initial word line gate structure facing the first surface 300 of the substrate is higher than a bottom surface of the first doped region 206 facing the first surface 300 of the substrate. Therefore, on the one hand, the first doped region 206 can contact directly with the initial gate dielectric layer 204, so as to ensure that the first doped region 206 is electrically coupled with the channel and the subsequently formed second doped region. On the other hand, a top surface of the initial word line gate structure facing the first surface 300 of the substrate is lower than the first surface 300 of the substrate 200, thereby reducing an excessive overlap between the channels formed in the subsequently formed word line gate structure in the active area 201 and the first doped region 206, and avoiding influencing performances of the first doped region 206.

The first doped region 206 includes doped ions, and a type of the doped ions is N-type or P-type. The N-type ions include phosphorus ions, arsenic ions, or antimony ions. The P-type ions include boron ions, boron fluoride ions, or indium ions.

Figures 11, 12:
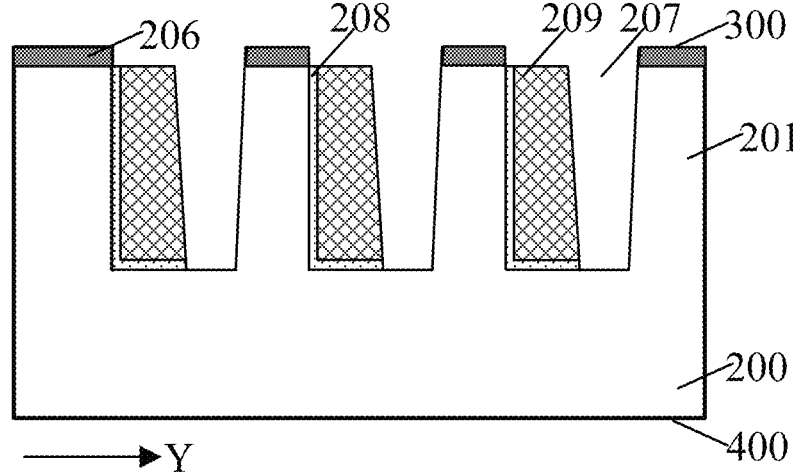

Referring to FIG. 11, FIG. 11 schematically illustrates a structural diagram based on FIG. 9. The first side wall and a part of the active area 201 adjacent to the first side wall are removed to form a word line gate structure, and a second recess 207 is disposed between the word line gate structure and the active area 201.

The word line gate structure includes: a gate dielectric layer 208 disposed on a side wall and the bottom surface of the first recess 203, and a gate layer 209 disposed on the gate dielectric layer 208. The word line gate structure is disposed in the substrate, and a channel controlled by the word line gate structure is perpendicular to a surface of the substrate, thereby reducing the area of the substrate in the horizontal direction and being conductive to increasing the density of storage array units.

The first side wall and a part of the active area 201 adjacent to the first side wall are removed, so that only the second side wall of the word line gate structure is in contact with the active area 201 to form a channel during operation, making the transistor meet performance requirements. Therefore, turning on and turning off the transistor is easy to control, and leakage current can thus be reduced.

According to some embodiments, a depth of the second recess 207 is greater than or equal to a depth of the word line gate structure. Therefore, the first isolation structure formed in the second recess 207 can make a channel in the first side wall of the word line gate structure completely turned off so as to reduce leakage current.

According to some embodiments, a process for removing the first side wall and a part of the active area 201 adjacent to the first side wall includes a dry etching process. The depth and the dimensional accuracy of the formed second recess 207 are easy to control during the dry etching process.

Figure 13:
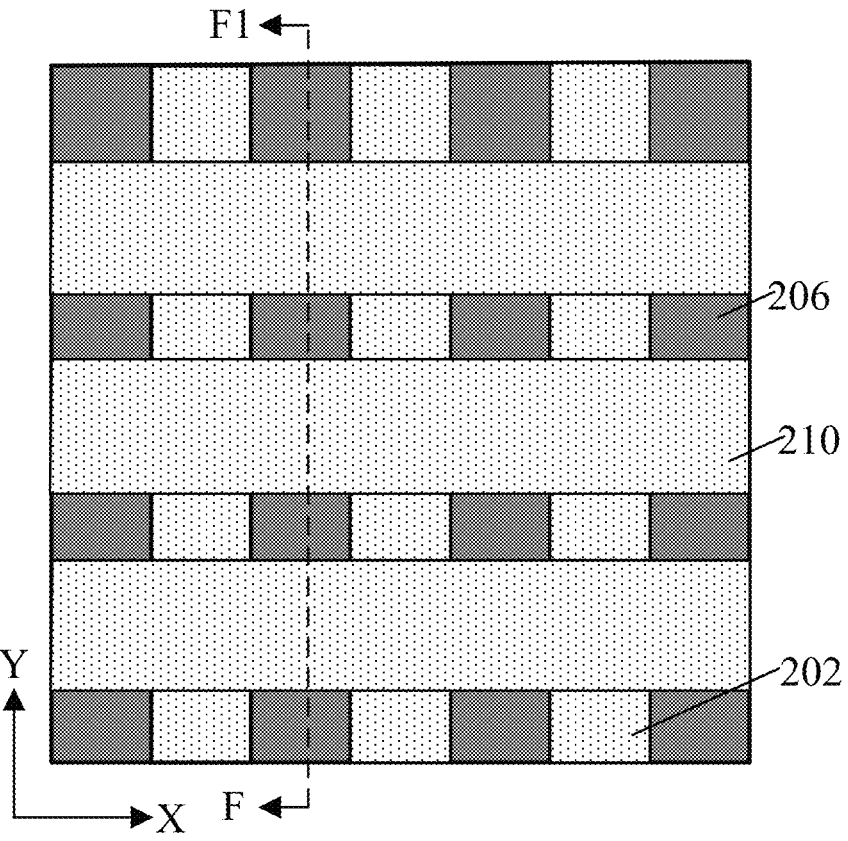

Referring to FIG. 12 and FIG. 13, FIG. 13 is a top view of FIG. 12. FIG. 12 schematically illustrates a cross-sectional structural diagram along the section line FF1 in FIG. 13. A first isolation structure 210 is formed in the second recess 207.

The first isolation structure 210 is also disposed on a top surface of the word line gate structure.

The first isolation structure 210 is disposed between the word line gate structure and the active area 201, and the second side wall of the word line gate structure is adjacent to the active area 201. Therefore, the first side wall of the word line gate structure and the active area 201 is isolated by the first isolation structure 210, avoiding parasitic devices with two channels produced when the word line gate structure contacts with both adjacent active areas, and making it easier to turn off the transistor. Therefore, leakage current can be reduced.

A method for forming the first isolation structure 210 includes: forming an isolation material layer (not shown) in the second recess 207, on the word line gate structure and on a surface of the active area 201; and planarizing the isolation material layer until the surface of the active area 201 is exposed to form the first isolation structure 210.

The first isolation structure 210 is made of a material including a dielectric material. The dielectric material includes one or more selected from a group consisting of: silicon oxide, silicon nitride, silicon carbide, silicon oxycarbide, silicon oxynitride, aluminum oxide, aluminum nitride, silicon carbide nitride and silicon oxycarbide nitride.

According to some embodiments, the first isolation structure 210 is made of a material including silicon oxide.

According to some embodiments, a depth of the first isolation structure 210 is greater than or equal to a depth of the word line gate structure. Therefore, the isolation effect of the first isolation structure 210 enables the channel in the first side wall of the word line gate structure to be completely turned off, thereby reducing leakage current.

Figure 14:
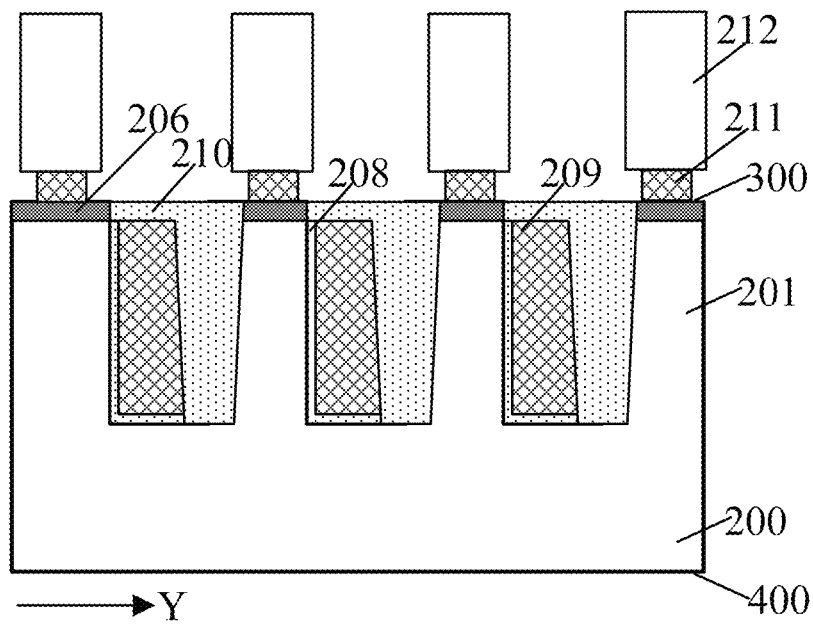
Figure 15:
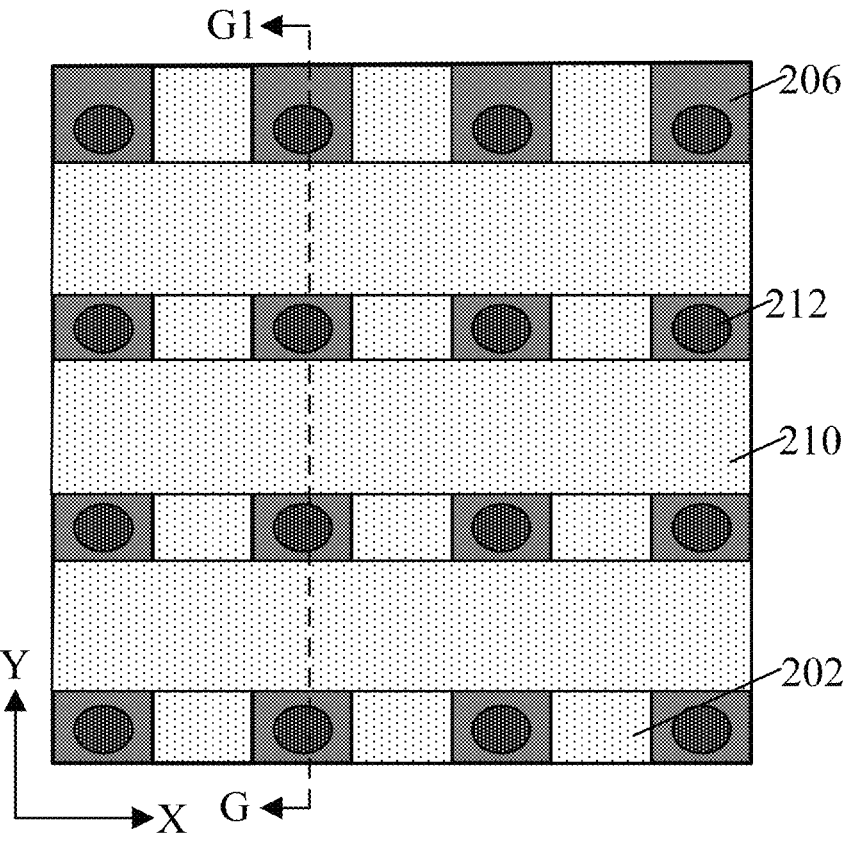

Referring to FIG. 14 and FIG. 15, FIG. 15 is a top view of the first surface 300 of the substrate in FIG. 14. FIG. 14 schematically illustrates a cross-sectional structural diagram along the section line GG1 in FIG. 15. A plurality of capacitor structures 212 are formed on each active area 201 exposed from the first surface 300 of the substrate, and each capacitor structure 212 is electrically coupled with a first doped region 206.

Each capacitor structure 212 is disposed on an active area 201 adjacent to the second side wall, and a projection of the capacitor structure 212 on the active area 201 exposed from the first surface coincides with at least a part of the first doped region 206.

According to some embodiments, a plurality of capacitor plugs 211 are formed on the first doped regions 206, and a capacitor plug 211 is electrically coupled with a capacitor structure 212 and a first doped region 206.

A method for forming a capacitor plug 211 and a capacitor structure 212 includes: forming a second dielectric layer (not shown) on the first isolation structure 210 and on the active area 201 exposed from the first surface 300 of the substrate; forming a fourth recess in the second dielectric layer (not shown); forming an opening (not shown) in the fourth recess, wherein a part of a surface of the first doped region 206 is exposed from the opening; and forming a capacitor plug 211 in the opening, and forming a capacitor structure 212 in the fourth recess.

The method for forming the capacitor plug 211 and the capacitor structure 212 involves forming a fourth recess in the second dielectric layer, forming an opening in the fourth recess, forming a capacitor plug in the opening, and then forming a capacitor structure in the fourth recess. The process window is large and the process is relatively simple, which can improve yield rate.

The capacitor structure 212 includes a first electrode layer (not shown), a second electrode layer (not shown), and a dielectric layer (not shown) disposed between the first electrode layer and the second electrode layer.

The dielectric layer takes a shape including a planar shape or a "U" shape.

When the dielectric layer takes a planar shape, a surface of the first electrode layer is flat, and a surface of the second electrode layer is flat.

When the dielectric layer takes a "U" shape, the surface of the first electrode layer is an uneven surface, and the surface of the second electrode layer is an uneven surface.

The first electrode layer is made of a material including a metal or a metal nitride. The second electrode layer is made of a material including a metal or a metal nitride. The metal includes one or more selected from a group consisting of copper, aluminum, tungsten, cobalt, nickel, and tantalum. The metal nitride includes one or more selected from a group consisting of tantalum nitride and titanium nitride.

The capacitor plug 211 is made of a material including a metal or a metal nitride. The metal includes one or more selected from a group consisting of copper, aluminum, tungsten, cobalt, nickel, and tantalum. The metal nitride includes one or more selected from a group consisting of tantalum nitride and titanium nitride.

According to some embodiments, a capacitor plug can be omitted, and a capacitor structure is directly electrically coupled with the first doped region.

A method for forming the capacitor structure includes: forming a second dielectric layer on a first isolation structure and an active area exposed from the first surface of the substrate; forming a fourth recess in the second dielectric layer, wherein a part of a surface of the first doped region is exposed from the fourth recess; and forming a capacitive structure in the fourth recess.

Thereafter, a plurality of bit lines 215 are formed on the second surface 400 of the substrate. The bit lines 215 are disposed along the first direction X and each bit line 215 is in parallel along the second direction Y. A process for forming the bit lines 215 could be referred to FIG. 16 to FIG. 24.

Figure 16:
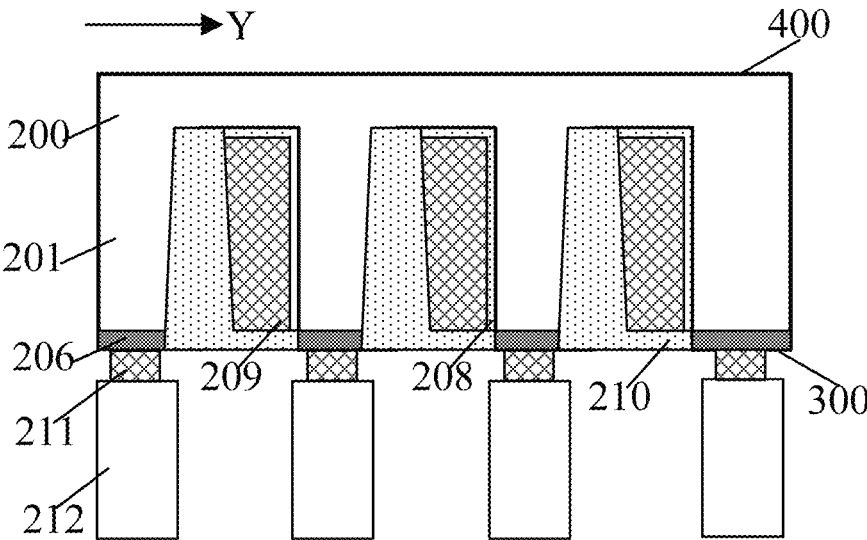
Figure 17:
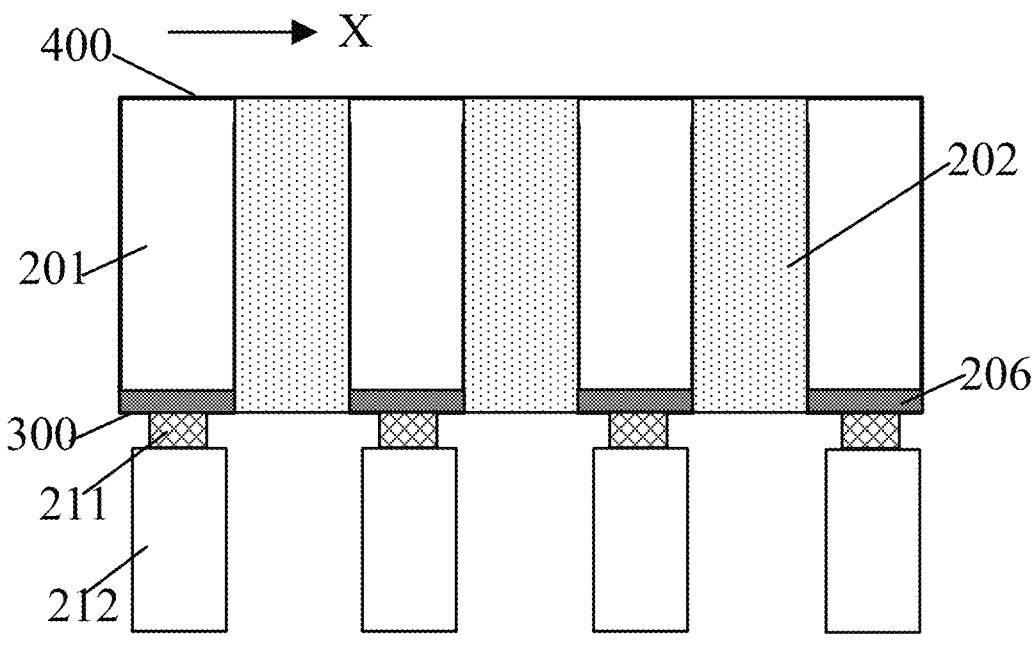
Figure 18:
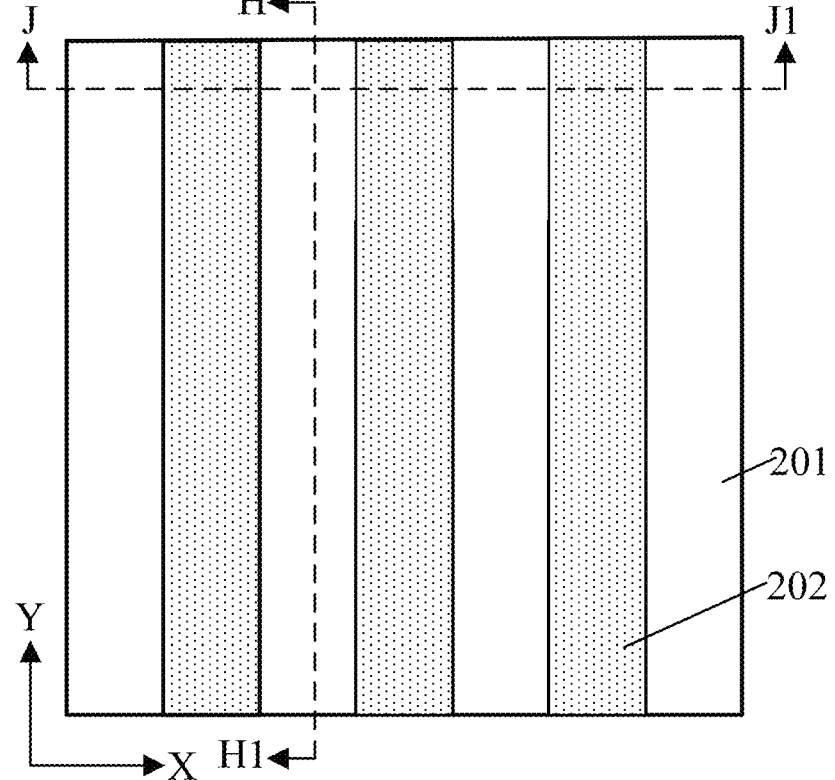

Referring to FIG. 16, FIG. 17 and FIG. 18, FIG. 18 is a top view of the second surface 400 of the substrate in FIG. 16 and FIG. 17. FIG. 16 schematically illustrates a cross-sectional structural diagram along the section line HH1 in FIG. 18. FIG. 17 schematically illustrates a cross-sectional structural diagram along the section line JJ1 in FIG. 18. The substrate is thinned from the second surface 400 until the second isolation structure 202 is exposed.

Thinning the substrate from the second surface includes: providing a base (not shown), wherein a surface of the base is bonded with the second dielectric layer; and turning the base and the substrate over and thinning the substrate from the second surface 400.

Thinning the substrate from the second surface 400 includes a chemical mechanical polishing process.

Figure 19:
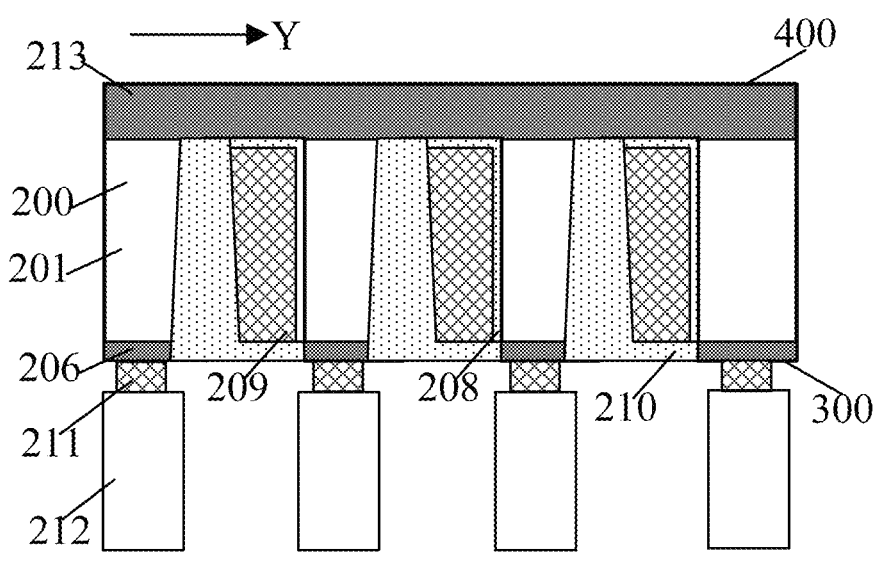
Figure 20:
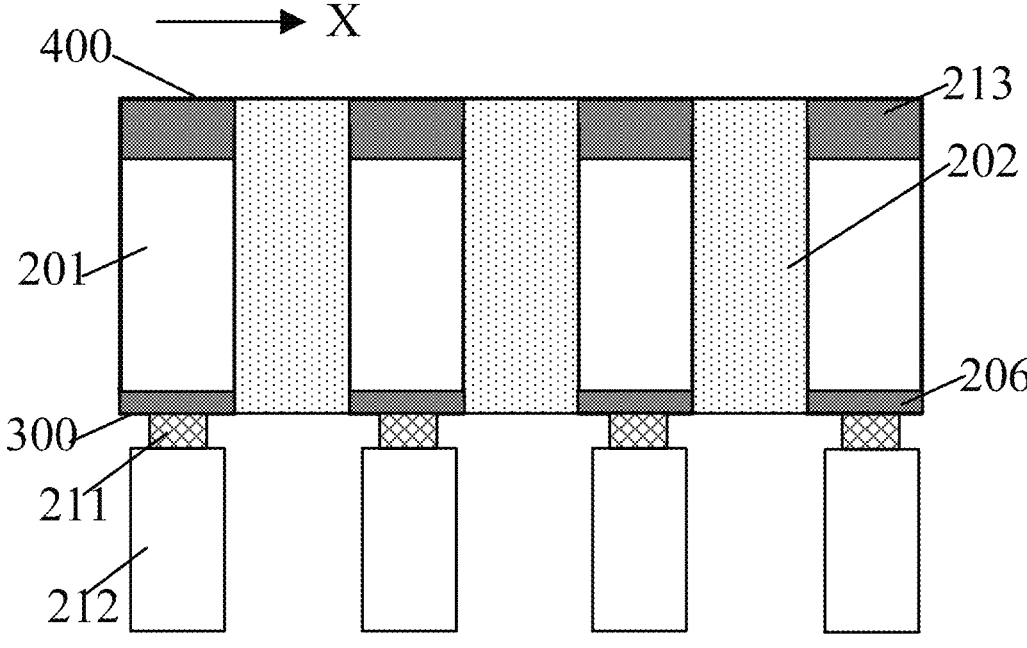
Figure 21:
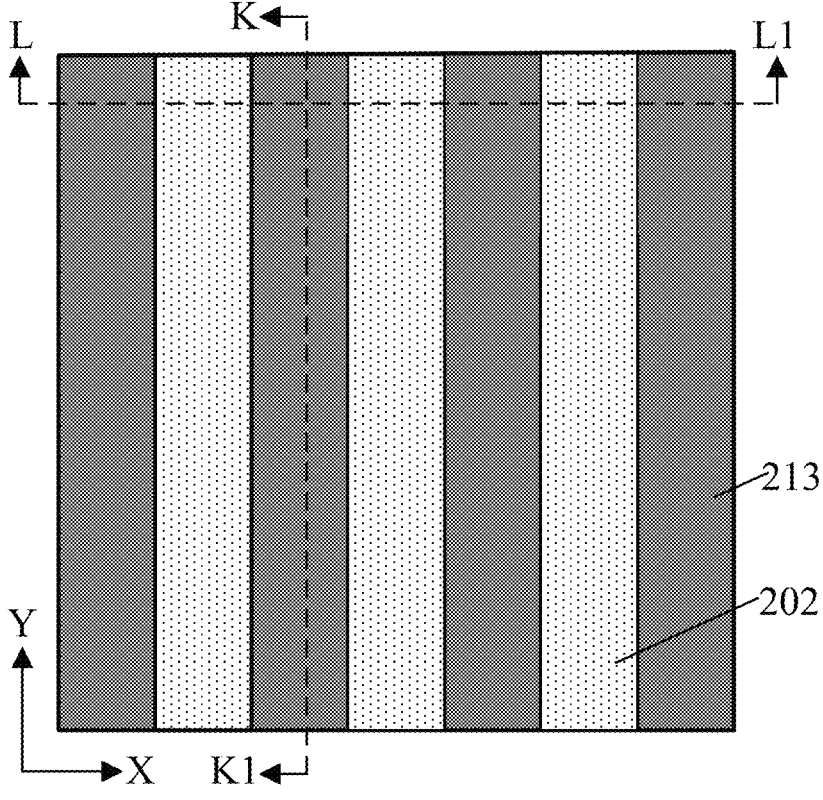

Referring to FIG. 19, FIG. 20 and FIG. 21, FIG. 21 is a top view of the second surface 400 of the substrate in FIG. 19 and FIG. 17. FIG. 19 schematically illustrates a cross-sectional structural diagram along the section line KK1 in FIG. 21. FIG. 20 schematically illustrates a cross-sectional structural diagram along the section line LL1 in FIG. 21. An ion implantation is performed into the active area 201 exposed from the second surface 400 of the substrate after the substrate is thinned, and a second doped region 213 is formed in the active area 201.

The first doped region 206 and the second doped region 213 are respectively disposed on two sides of the substrate 200, thereby reducing the area of the substrate 200 in the horizontal direction and being conductive to increasing the density of the storage array units.

A depth of the second doped region 213 is greater than or equal to a spacing between the word line gate structure and the second surface 400 of the substrate 200. Therefore, the second doped region 213 can directly contact with the gate dielectric layer 208, so as to ensure that the second doped region 213 is electrically coupled with the channel and the first doped region 206.

The second doped region 213 includes doped ions, and a type of the doped ions is N-type or P-type. The N-type ions include phosphorus ions, arsenic ions, or antimony ions. The P-type ions include boron ions, boron fluoride ions, or indium ions.

Figure 22:
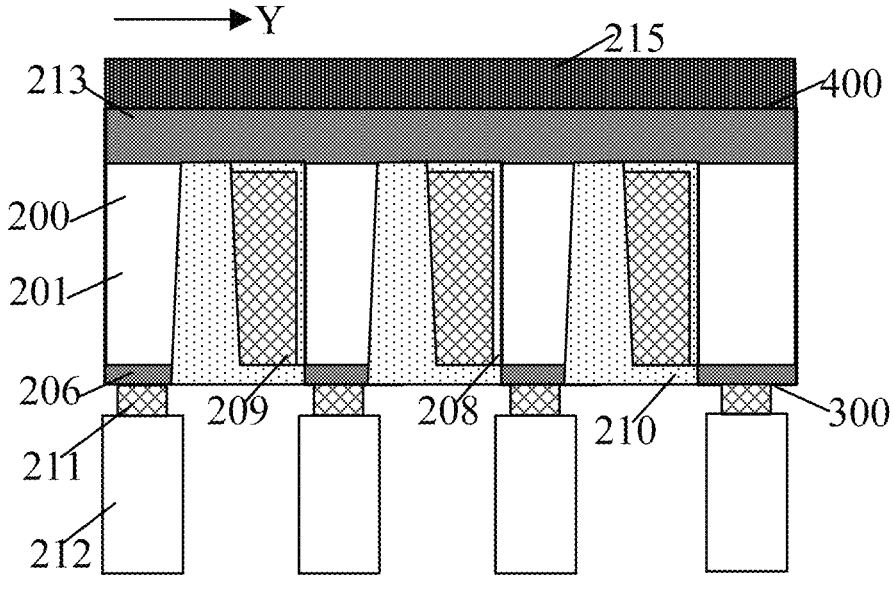
Figure 23:
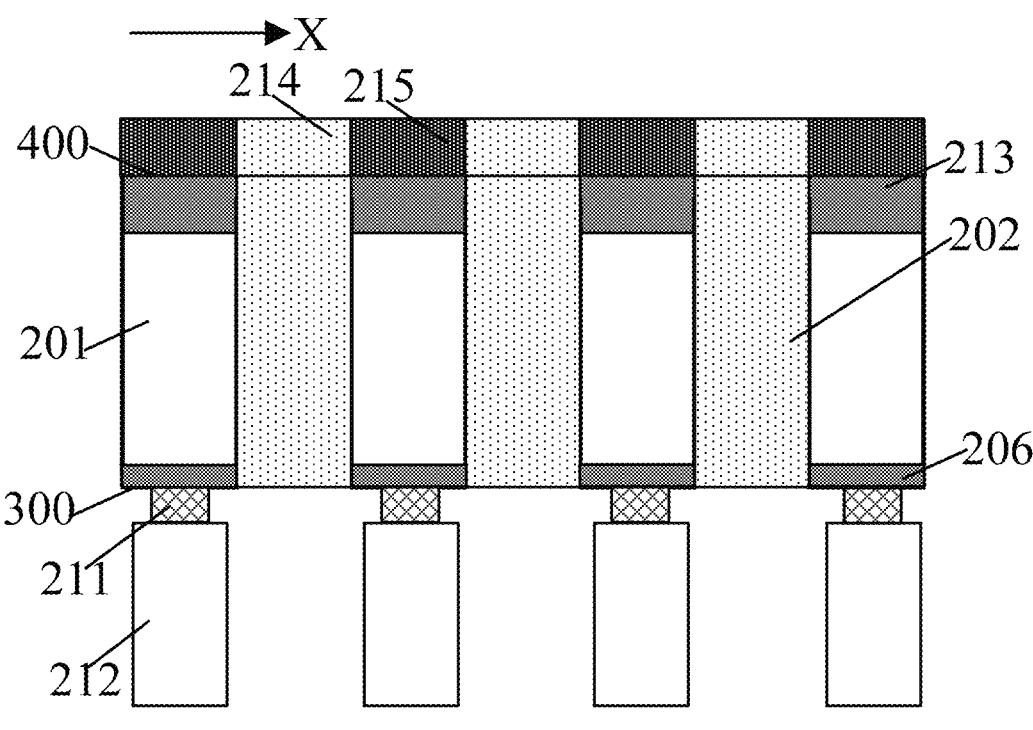
Figure 24:
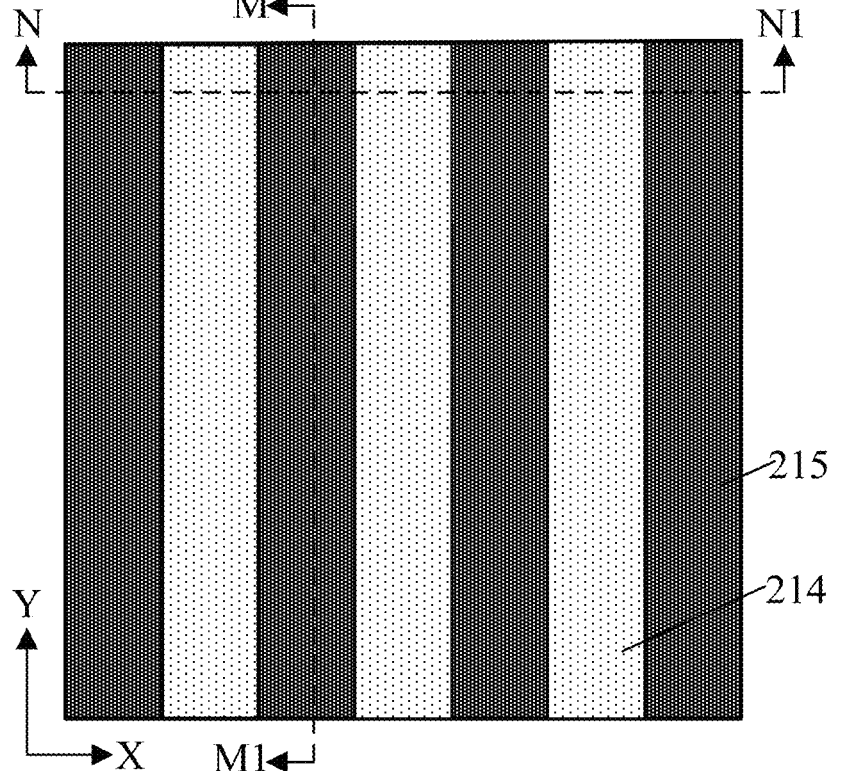

According to some embodiments, a conductive type of the doped ions in the second doped region 213 is the same as a conductive type of the doped ions in the first doped region 206. Referring to FIG. 22, FIG. 23 and FIG. 24, FIG. 24 is a top view of the second surface 400 of the substrate in FIG. 22 and FIG. 23. FIG. 22 schematically illustrates a cross-sectional structural diagram along the section line MM1 in FIG. 24. FIG. 23 schematically illustrates a cross-sectional structural diagram along the section line NN1 in FIG. 24. A plurality of bit lines 215 are formed on the second doped region 213, and each bit line 215 is electrically coupled with the second doped regions 213 disposed in a row along the second direction Y.

Forming the bit line 215 includes: forming a first dielectric layer 214 on the active area 201 exposed from the second surface 400 of the substrate and on the second isolation structure 202, wherein the first dielectric layer 214 has a plurality of third recesses (not shown), and the second doped region 213 is exposed from a third recess; and forming the bit line 215 in the third recess.

The bit line 215 includes: a barrier layer (not shown) disposed on the side wall and bottom surface of the third recess, and a bit line layer (not shown) disposed on the barrier layer.

The barrier layer is made of a material including a metal nitride. The bit line layer is made of a material including a metal or a metal nitride. The metal includes one or more selected from a group consisting of copper, aluminum, tungsten, cobalt, nickel, and tantalum. The metal nitride includes one or more selected from a group consisting of tantalum nitride and titanium nitride.

According to some embodiments, a bit line plug is disposed on the second doped region, and the bit line plug is electrically coupled with the bit line and the second doped region.

The semiconductor structure is formed. In an aspect, the capacitor structure 212 is disposed on the first surface 300 of the substrate, and the bit line 215 is disposed on the second surface 400 of the substrate, which could greatly reduce the difficulty and cost of the manufacturing process. In another aspect, the word line gate structure is disposed in the substrate, and a channel controlled by the word line gate structure is perpendicular to a surface of the substrate, thereby reducing the area of the substrate in the horizontal direction and being conductive to increasing the density of storage array units. In yet another aspect, a first isolation structure 210 is disposed between the word line gate structure and the active area 201, and the second side wall of the word line gate structure is adjacent to the active area 201, which makes the active area 201 and the first side wall of the word line gate structure isolated by the first isolation structure 210, avoiding parasitic devices with two channels produced when the word line gate structure contacts with both adjacent active areas 201, and makes it easier to turn off the transistor. Therefore, leakage current can be reduced and performances of the semiconductor structure can be improved.

Accordingly, some embodiments of the present disclosure also provide a semiconductor structure, referring to FIG. 22, FIG. 23, and FIG. 24, the semiconductor structure includes:

a substrate 200 including a first surface 300 and a second surface 400 opposite to the first surface 300, wherein the substrate 200 includes a plurality of active areas 201 separated from each other and arranged along a first direction X, the active areas 201 are disposed in parallel along a second direction Y, and the first direction X is disposed perpendicular to the second direction Y;

a plurality of first recesses in the substrate 200, wherein the first recesses stretch from the first surface 300 to the second surface 400, and the first recesses are arranged along the second direction Y and run through an active area 201 along the first direction X;

a word line gate structure disposed in a first recess, wherein the word line gate structure includes a first side wall and a second side wall opposite to the first side wall, and the second side wall is adjacent to an active area 201;

a first isolation structure 210 disposed in the first recess, wherein the first isolation structure 210 is adjacent to the first side wall of the word line gate structure, and the first isolation structure 210 is disposed between the word line gate structure and an active area 201, and also disposed in a part of an active area 201;

a plurality of capacitor structures 212 on the first surface 300 of the substrate 200, wherein each of the capacitor structures 212 is electrically coupled with an active area 201; and a plurality of bit lines 215 on the second surface 400 of the substrate 200, wherein the bit lines 215 are arranged along the first direction X and parallel to the second direction Y.

According to some embodiments, the word line gate structure includes a gate dielectric layer 208 disposed on a side wall and a bottom surface of the first recess, and a gate layer 209 disposed on the gate dielectric layer 208.

According to some embodiments, a depth of the first isolation structure 210 is greater than or equal to a depth of the word line gate structure.

According to some embodiments, the gate layer 209 is made of a material selected from a group consisting of polycrystalline silicon and a metal, and the metal includes tungsten.

According to some embodiments, the semiconductor structure also includes a first doped region 206 in an active area 201 exposed on from the first surface 300 of the substrate 200. Each capacitor structure 212 is respectively electrically coupled with the first doped region 206.

According to some embodiments, a projection of the capacitor structure 212 on the first surface 300 of the substrate 200 coincides with at least a part of the first doped region 206.

According to some embodiments, the semiconductor structure also includes a plurality of capacitor plugs 211 disposed between the capacitor structures 212 and the first doped region 206. A capacitor plug 211 is electrically coupled with a capacitor structure 212 and the first doped region 206.

According to some embodiments, a top surface of the word line gate structure facing the first surface 300 of the substrate 200 is higher than a bottom surface of the first doped region 206 facing the first surface 300 of the substrate 200.

According to some embodiments, the semiconductor structure also includes a plurality of second doped regions 213 in the active areas 201 exposed from the second surface 400 of the substrate 200. Each bit line 215 is respectively electrically coupled with each second doped region 213 arranged in a row along the second direction Y.

According to some embodiments, a depth of a second doped region 213 is greater than or equal to a spacing between the word line gate structure and the second surface 400 of the substrate 200.

According to some embodiments, the semiconductor structure also includes a plurality of bit line plugs. A bit line plug is disposed between a bit line and a second doped region, and the bit line plug is electrically coupled with the bit line and the second doped region.

According to some embodiments, a second isolation structure 202 is disposed between adjacent active areas, and the second isolation structure 202 is exposed from the second surface 400 of the substrate.

According to some embodiments, the semiconductor structure also includes a first dielectric layer 214 disposed on the second surface 400 of the substrate 200 and on the second isolation structure 202. A plurality of third recesses are formed in the first dielectric layer 214, an active area 201 is exposed from a third recess, and a bit line 215 is disposed in the third recess.

According to some embodiments, the bit line 215 includes: a barrier layer disposed on a side wall and a bottom surface of the third recess, and a bit line layer disposed on the barrier layer.

According to some embodiments, the second isolation structure 202 is made of a material including a dielectric material, and the dielectric material includes silicon oxide.

According to some embodiments, the first isolation structure 210 is made of a material including a dielectric material, and the dielectric material includes silicon oxide.

According to some embodiments, the semiconductor structure also includes a second dielectric layer disposed on the first isolation structure 210 and on the first surface 300 of the substrate. A capacitor structure is disposed in the second dielectric layer.

According to some embodiments, each capacitor structure 212 is disposed on an active area 201 adjacent to the second side wall.

Figure 25:
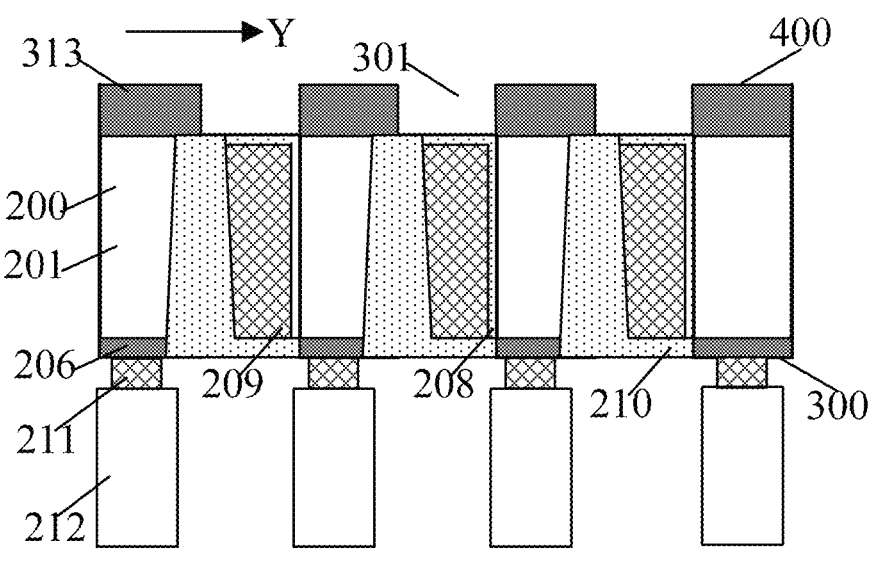
FIG. 25 to FIG. 27 schematically illustrate diagrams of an intermediate semiconductor structure according to another embodiment of the present disclosure.
Figure 26:
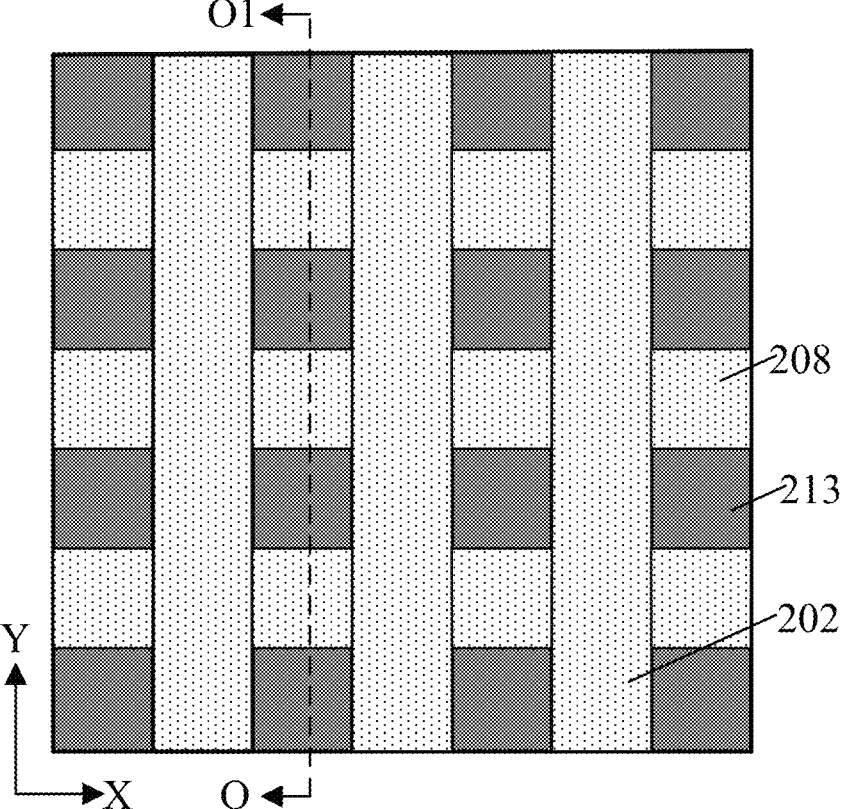
Figure 27:
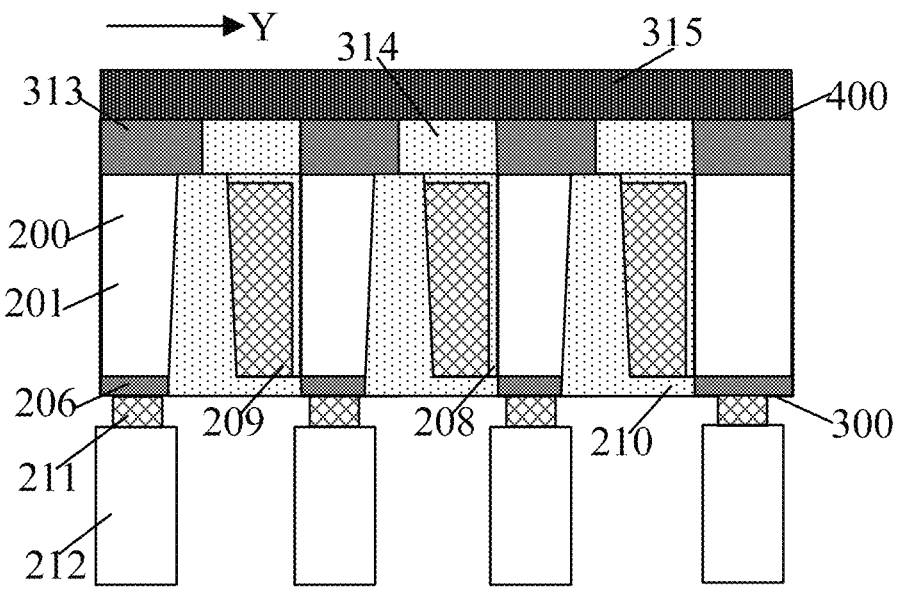

FIG. 25 to FIG. 27 schematically illustrate diagrams of an intermediate semiconductor structure according to another embodiment of the present disclosure.

Referring to FIG. 25 and FIG. 26, FIG. 25 schematically illustrates a structural diagram based on FIG. 19, FIG. 26 schematically illustrates a structural diagram based on FIG. 21, FIG. 26 is a top view of the second surface 400 of the substrate in FIG. 25, and FIG. 25 schematically illustrates a cross-sectional structural diagram along the section line OO1 in FIG. 26. The active area 201 at the bottom of the word line gate structure is removed until the gate dielectric layer 208 is exposed, a fifth recess 301 is formed in each active area 201, and the second doped regions 313 are formed and separated from each other in the active area 201 exposed from the second surface 400 of the substrate 200.

Referring to FIG. 27, FIG. 27 schematically illustrates a structural diagram based on FIG. 25. A first dielectric layer 314 is disposed in the fifth recess 301, on the active area 201 exposed from the second surface 400 of the substrate, and on the second isolation structure 202. A plurality of third recesses (not shown) are formed in the first dielectric layer 314, and a surface of the second doped region 313 is exposed from the third recess. A bit line 315 is disposed in the third recess.

The active areas 201 exposed from the second surface 400 of the substrate are separated from each other, resulting in a decrease in capacitance after a bit line 315 is formed on the second doped region 313.

Accordingly, some embodiments of the present disclosure also provide a semiconductor structure. Referring to FIG. 27, the difference in structure between FIG. 27 and FIG. 22 is that the surface of the gate dielectric layer 208 is exposed from the second surface 400 of the substrate.

According to some embodiments, the semiconductor structure also includes: a fifth recess (not shown) formed in the active area 201 at the bottom of the word line gate structure, wherein the fifth recess stretches from the second surface 400 of the substrate to the first surface 300 of the substrate, the surface of the gate dielectric layer 208 is exposed from the fifth recess, and the first dielectric layer 314 is also disposed in the fifth recess; and a plurality of second doped regions 313 are formed in the active area 201 exposed from the second surface 400. The second doped regions 313 are separated from each other, and the fifth recess is formed between adjacent second doped regions 313.

The active areas 201 exposed from the second surface 400 of the substrate are separated from each other, resulting in a decrease in capacitance after a bit line 215 is disposed on the second doped region 313.

Figure 28:
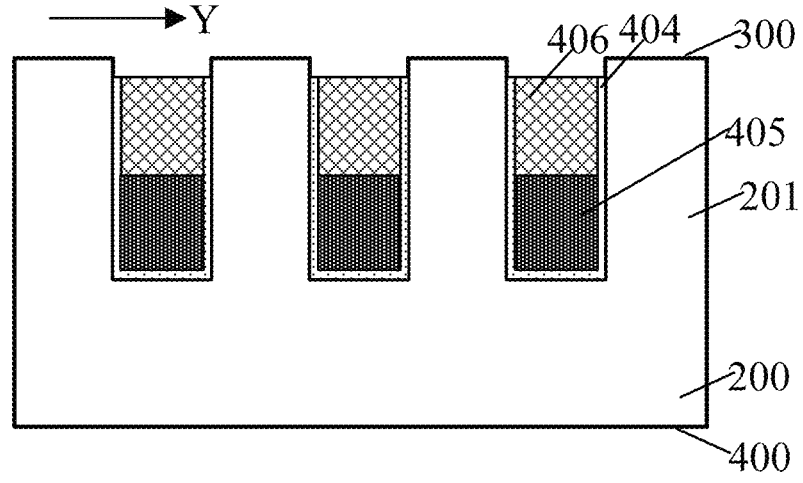
FIG. 28 and FIG. 29 schematically illustrate diagrams of an intermediate semiconductor structure according to another embodiment of the present disclosure.
Figure 29:
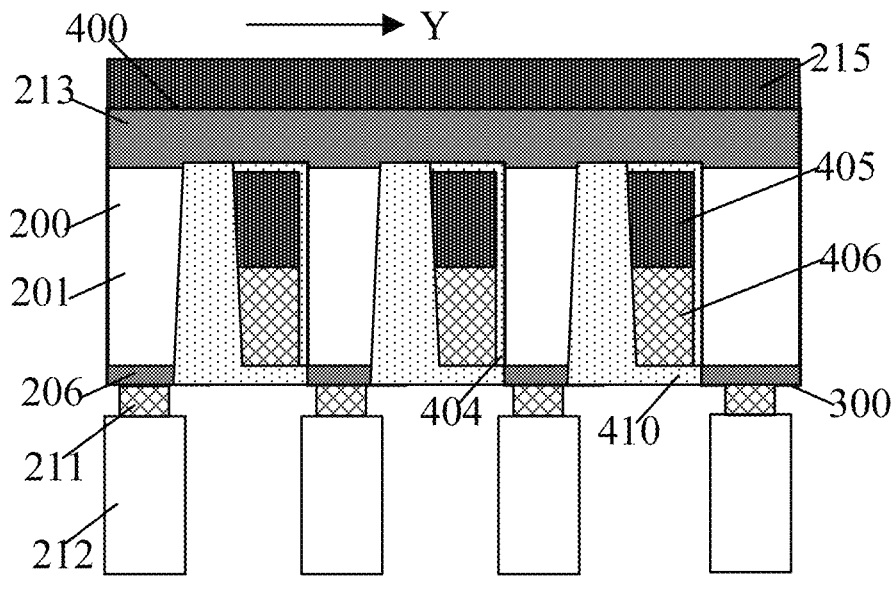

FIG. 28 and FIG. 29 schematically illustrate diagrams of an intermediate semiconductor structure according to another embodiment of the present disclosure.

Referring to FIG. 28, FIG. 28 schematically illustrates a structural diagram based on FIG. 4. An initial word line gate structure is formed in the first recess 203. The initial word line gate structure includes a first side wall (not shown) and a second side wall (not shown) opposite to the first side wall, and the first side wall and second side wall are respectively adjacent to the active area 201.

The initial word line gate structure includes: an initial gate dielectric layer 404 disposed on a side wall and a bottom surface of the first recess 203, and an initial gate layer disposed on the initial gate dielectric layer 404.

According to some embodiments, the initial gate layer includes: a first part 405 disposed on a bottom of the first recess 203 and a second part 406 disposed on the first part 405. The first part 405 and the second part 406 are different in materials.

The first part 405 is made of a material selected from a group consisting of polycrystalline silicon and a metal, and the metal includes tungsten. The second part 406 is made of a material selected from a group consisting of polycrystalline silicon and a metal, and the metal includes tungsten.

The materials of the gate layer are not all made of polycrystalline silicon or metal, which improves resistance performances of the gate layer and reduces leakage current of the gate layer. A high resistance of the gate layer made of polycrystalline silicon and a current leakage of the gate layer made of metal can be avoided, thereby improving performances of the semiconductor structure.

According to some embodiments, the first part 405 is made of a material including polycrystalline silicon. The second part 406 is made of a material including tungsten.

According to some embodiments, the first part is made of a material including tungsten. The second part is made of a material including polycrystalline silicon.

A method for forming the initial word line gate structure includes: forming a initial gate dielectric material layer (not shown) on the side wall and the bottom surface of the first recess 203, and on the active area 201 exposed from the first surface 300 of the substrate; forming an initial first part on the initial gate dielectric material layer (not shown); etching back the initial first part until a top surface of the initial first part is lower than a top surface of the active area 201 and a part of the initial gate dielectric material layer disposed on the side wall of the first recess 201 is exposed, and forming the first part 405; forming an initial second part (not shown) on the first part 405; planarizing the initial second part and the initial gate dielectric material layer at a top of the active area 201 exposed from the first surface 300 of the substrate until the top surface of the active area 201 exposed from the first surface 300 of the substrate is exposed, and forming the initial gate dielectric layer 404 and a transitional second part (not shown); and etching back the transitional second part to form the second part 406.

Referring to FIG. 29, after the initial word line gate structure is formed, an ion implantation is performed into the active area 201 exposed from the first surface 300 of the substrate 200 to form a first doped region 206 in the active area 201. The first side wall and a part of the active area 201 adjacent to the first side wall are removed to form a word line gate structure, and a second recess is disposed between the word line gate structure and the active area 201. A first isolation structure 410 is formed in the second recess. A plurality of capacitor structures 212 are formed on each active area 201 exposed from the first surface 300 of the substrate 200, and each capacitor structure 212 is electrically coupled with a first doped region 206. An ion implantation is performed into the active area 201 exposed from the second surface 400 of the substrate 200 to form a second doped region 213 in the active area 201. A plurality of bit lines 215 are formed on the second doped region 213, each bit line 215 is electrically coupled with the second doped regions 213 arranged in a row of along the second direction Y.

A process for forming the first doped region 206, the first isolation structure 210, the capacitor structure 212, the second doped region 213 and the bit line 215 can be referred to FIG. 9 to FIG. 24, which is not repeated here.

Accordingly, some embodiments of the present disclosure also provide a semiconductor structure. Referring to FIG. 29, the difference in structure between FIG. 29 and FIG. 22 is that the gate layer includes a first part 405 disposed on a bottom of the first recess and a second part 406 disposed on the first part 405, and the first part 405 and the second part 406 are different in materials.

According to some embodiments, the first part 405 is made of a material including a metal, and the metal includes tungsten. The second part 406 is made of a material including polycrystalline silicon.

According to some embodiments, the first part is made of a material including polycrystalline silicon. The second part is made of a material including a metal, and the metal includes tungsten.

Figure 30:
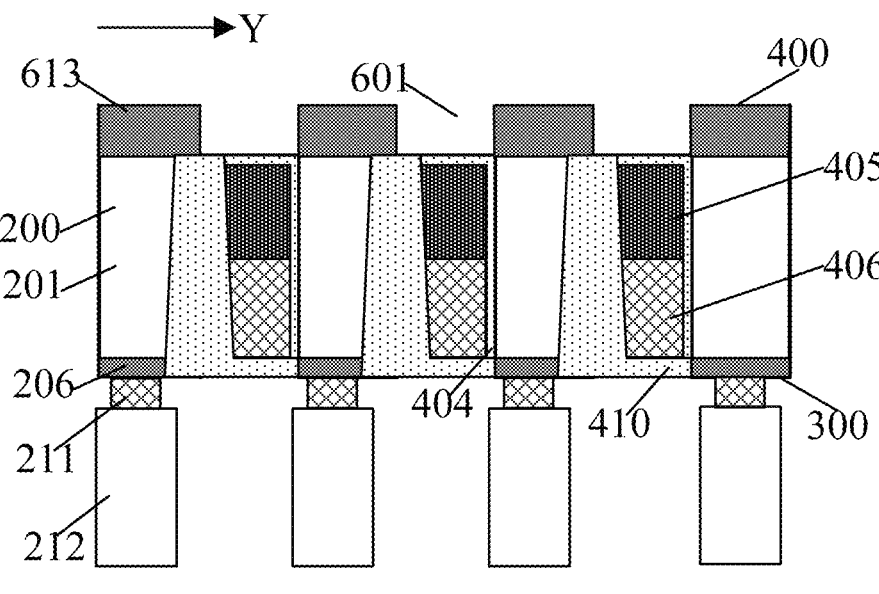
FIG. 30 and FIG. 31 schematically illustrate diagrams of an intermediate semiconductor structure according to another embodiment of the present disclosure.
Figure 31:
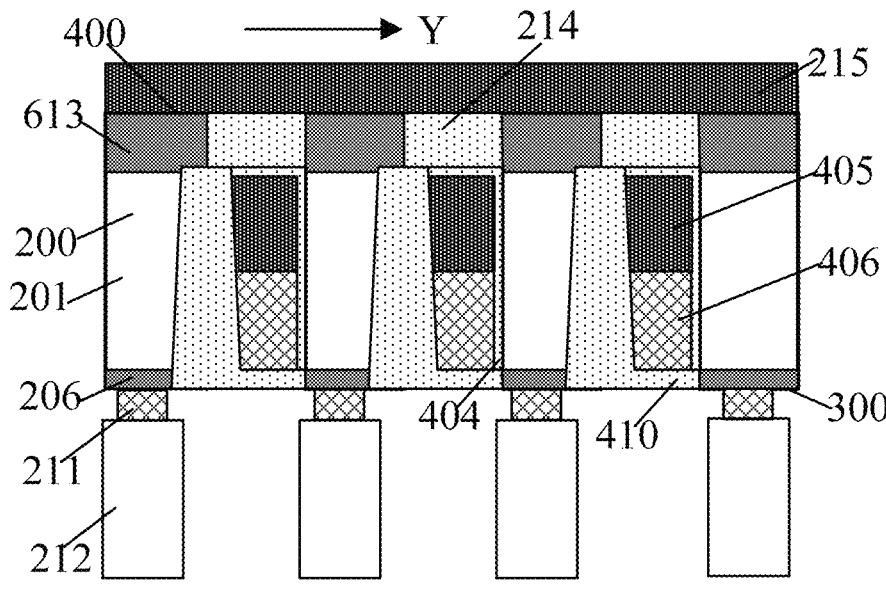

FIG. 30 and FIG. 31 schematically illustrate diagrams of an intermediate semiconductor structure according to another embodiment of the present disclosure.

Referring to FIG. 30, FIG. 30 schematically illustrates a structural diagram based on FIG. 28. After the initial word line gate structure is formed, an ion implantation is performed into the active area 201 exposed from the first surface 300 of the substrate 200 to form a first doped region 206 in the active area 201. The first side wall and a part of the active area 201 adjacent to the first side wall are removed to form a word line gate structure, and a second recess is formed between the word line gate structure and the active area 201. A first isolation structure 410 is formed in the second recess. A plurality of capacitor structures 212 are formed on each active area 201 exposed from the first surface 300 of the substrate 200, and each capacitor structure 212 is electrically coupled with a first doped region 206. An ion implantation is performed into the active area 201 exposed from the second surface 400 of the substrate 200 to form a second doped region 613 in the active area 201.

A process for forming the first doped region 206, the first isolation structure 210, the capacitor structure 212, and the second doped region 613 can be referred to FIG. 9 to FIG. 21, which is not repeated here.

Referring to FIG. 30, the active area 201 disposed at the bottom of the word line gate structure is removed until the surface of the gate dielectric layer 404 is exposed, a fifth recess 601 is formed in each active area 201, and the second doped regions 613 are formed and separated from each other in the active area 201 exposed from the second surface 400 of the substrate 200.

Referring to FIG. 31, a first dielectric layer 214 is formed in the fifth recess 601, on the active area 201 exposed from the second surface 400 of the substrate, and on the second isolation structure 202. A plurality of third recesses (not shown) are arranged in the first dielectric layer 214, and the second doped region 613 is exposed from the third recess. A bit line 215 is disposed in the third recess.

The active areas 201 exposed from the second surface 400 of the substrate are separated from each other, resulting in a decrease in capacitance after a bit line 215 is disposed on the second doped region 613.

Accordingly, some embodiments of the present disclosure also provide a semiconductor structure. Referring to FIG. 31, the difference in structure between FIG. 31 and FIG. 22 is that the surface of the gate dielectric layer 208 is exposed from the second surface 400 of the substrate, the gate layer includes: a first part 405 disposed on a bottom of the first recess and a second part 406 disposed on the first part 405. The first part 405 and the second part 406 are different in materials.

According to some embodiments, the first part 405 is made of a material including a metal, and the metal includes tungsten. The second part 406 is made of a material including polycrystalline silicon.

According to some embodiments, the first part is made of a material including polycrystalline silicon. The second part is made of a material including a metal, and the metal includes tungsten.

According to some embodiments, the semiconductor structure also includes: a fifth recess (not shown) formed in the active area 201 at the bottom of the word line gate structure, wherein the fifth recess stretches from the second surface 400 of the substrate to the first surface 300 of the substrate, the surface of the gate dielectric layer 208 is exposed from the fifth recess, and the first dielectric layer 214 is also disposed in the fifth recess; a plurality of second doped regions 613 are formed in the active area 201 exposed from the second surface 400, wherein the second doped regions 613 are separated from each other, and the fifth recess is arranged between adjacent second doped regions 613.

The active areas 201 exposed from the second surface 400 of the substrate are separated from each other, resulting in a decrease in capacitance after a bit line 215 is formed on the second doped region 613.

Although the present disclosure has been disclosed above, the disclosure is not limited hereto. Those skilled in the art can modify and vary the embodiments without departing from the spirit and scope of the present disclosure. Therefore, the scope of protection of the present disclosure shall be subject to the scope defined in claims.

What is claimed is:

1. A method for forming a semiconductor structure, comprising:
    providing a substrate comprising a first surface and a second surface opposite to the first surface, wherein the substrate comprises a plurality of active areas separated from each other and arranged along a first direction, the active areas are disposed in parallel along a second direction, and the first direction is disposed perpendicular to the second direction;
    forming a plurality of first recesses in the substrate, wherein the first recesses stretch from the first surface to the second surface, and the first recesses are arranged along the second direction and run through an active area along the first direction;
    forming an initial word line gate structure in a first recess, wherein the initial word line gate structure comprises a first side wall and a second side wall opposite to the first side wall, and the first side wall and the second side wall are respectively adjacent to the active area;
    removing the first side wall and a part of the active area adjacent to the first side wall to form a word line gate structure and to form a second recess between the word line gate structure and the active area;
    forming a first isolation structure in the second recess;
    forming a plurality of capacitor structures on the first surface of the substrate, wherein each of the capacitor structures is electrically coupled with an active area adjacent to the second recess; and
    forming a plurality of bit lines on the second surface of the substrate, wherein the bit lines are arranged along the first direction and parallel to the second direction.

2. The method according to claim 1, wherein the word line gate structure comprises: a gate dielectric layer disposed on a side wall and a bottom surface of the first recess, and a gate layer disposed on the gate dielectric layer; and
    a depth of the first isolation structure is greater than or equal to a depth of the word line gate structure.

3. The method according to claim 2, wherein the gate layer comprises a first part disposed on a bottom of the first recess and a second part disposed on the first part, and the first part and the second part are different in materials;
    the first part is made of a material selected from a group consisting of polycrystalline silicon and a metal, and the metal comprises tungsten; and
    the second part is made of a material selected from a group consisting of polycrystalline silicon and a metal, and the metal comprises tungsten.

4. The method according to claim 2, wherein a second isolation structure is disposed between adjacent active areas, and forming the bit lines on the second surface of the substrate comprises:
    thinning the substrate from the second surface until the second isolation structure is exposed;
    performing an ion implantation into the active areas exposed from the second surface of the substrate after thinning to form a plurality of second doped regions in the active areas; and forming the bit lines on the second doped regions, wherein each of the bit lines is electrically coupled with the second doped regions arranged in a row along the second direction.

5. The method according to claim 4, further comprising: before forming the bit lines on the second doped regions, forming a plurality of bit line plugs on the second doped regions, wherein a bit line plug is electrically coupled with a bit line and a second doped region.

6. The method according to claim 4, further comprising: after performing an ion implantation into the active areas exposed from the second surface of the substrate after thinning and before forming the bit lines on the second doped regions, removing a part of an active area at a bottom of the word line gate structure until the gate dielectric layer is exposed, forming a fifth recess in each of the active areas, and forming the second doped regions separated from each other in the active areas exposed from the second surface of the substrate; wherein a depth of a second doped region is greater than or equal to a spacing between the word line gate structure and the second surface of the substrate.

7. The method according to claim 4, wherein the forming the bit lines comprises:

forming a first dielectric layer on an active area exposed from the second surface of the substrate and on the second isolation structure, wherein a plurality of third recesses are formed in the first dielectric layer, and active areas are exposed from the third recesses; and forming the bit lines in the third recesses;

wherein a bit line comprises: a barrier layer disposed on a side wall and a bottom surface of a third recess, and a bit line layer disposed on the barrier layer.

8. The method according to claim 4, wherein forming a capacitor structure comprises:

forming a second dielectric layer on the first isolation structure and on an active area exposed from the first surface of the substrate;

forming a fourth recess in the second dielectric layer, wherein a part of the active area is exposed from the fourth recess; and forming a capacitor structure in the fourth recess.

9. The method according to claim 8, wherein thinning the substrate from the second surface comprises:

providing a base, wherein a surface of the base is bonded with the second dielectric layer; and turning the base and the substrate over and thinning the substrate from the second surface.

10. The method according to claim 1, further comprising: after forming the initial word line gate structure and before removing the first side wall and the part of the active area adjacent to the first side wall, performing an ion implantation into an active area exposed from the first surface of the substrate to form a first doped region in the active area, wherein a capacitor structure is electrically coupled with the first doped region;

wherein a projection of the capacitor structure on the first surface of the substrate coincides with at least a part of the first doped region; and the method further comprises: after forming the first isolation structure and before forming the capacitor structure on the active area, forming a capacitor plug on the first doped region, wherein the capacitor plug is electrically coupled with the capacitor structure and the first doped region.

11. The method according to claim 10, wherein a top surface of the word line gate structure facing the first surface of the substrate is higher than a bottom surface of the first doped region facing the first surface of the substrate.

12. The method according to claim 1, wherein each of the capacitor structures is disposed on an active area adjacent to the second side wall.

13. A semiconductor structure, comprising:

a substrate comprising a first surface and a second surface opposite to the first surface, wherein the substrate comprises a plurality of active areas separated from each other and arranged along a first direction, the active areas are disposed in parallel along a second direction, and the first direction is disposed perpendicular to the second direction;

a plurality of first recesses in the substrate, wherein the first recesses stretch from the first surface to the second surface, and the first recesses are arranged along the second direction and run through an active area along the first direction;

a word line gate structure disposed in a first recess, wherein the word line gate structure comprises a first side wall and a second side wall opposite to the first side wall, and the second side wall is adjacent to an active area;

a first isolation structure disposed in the first recess, wherein the first isolation structure is adjacent to the first side wall of the word line gate structure, and the first isolation structure is disposed between the word line gate structure and an active area, and also disposed in a part of an active area;

a plurality of capacitor structures disposed on the first surface of the substrate, wherein each of the capacitor structures is electrically coupled with an active area; and a plurality of bit lines disposed on the second surface of the substrate, wherein the bit lines are arranged along the first direction and parallel to the second direction.

14. The semiconductor structure according to claim 13, wherein the word line gate structure comprises: a gate dielectric layer disposed on a side wall and a bottom surface of the first recess, and a gate layer disposed on the gate dielectric layer;

a depth of the first isolation structure is greater than or equal to a depth of the word line gate structure; and a bottom surface of the gate dielectric layer is also exposed from the second surface of the substrate.

15. The semiconductor structure according to claim 14, wherein the gate layer comprises a first part disposed on a bottom of the first recess and a second part disposed on the first part, and the first part and the second part are different in materials;

the first part is made of a material selected from a group consisting of polycrystalline silicon and a metal, and the metal comprises tungsten; and the second part is made of a material selected from a group consisting of polycrystalline silicon and a metal, and the metal comprises tungsten.

16. The semiconductor structure according to claim 13, also comprising:

a first doped region in an active area exposed on from the first surface of the substrate, wherein each of the capacitor structures is respectively electrically coupled with the first doped region;

wherein a projection of a capacitor structure on the first surface of the substrate coincides with at least a part of the first doped region; and the semiconductor structure also comprises: a plurality of capacitor plugs disposed between the capacitor structures and the first doped region, wherein a capacitor plug is electrically coupled with a capacitor structure and the first doped region.

17. The semiconductor structure according to claim 16, wherein a top surface of the word line gate structure facing the first surface of the substrate is higher than a bottom surface of the first doped region facing the first surface of the substrate.

18. The semiconductor structure according to claim 13, also comprising:

a plurality of second doped regions in the active areas exposed from the second surface of the substrate, wherein each of the bit lines is electrically coupled with the second doped regions arranged in a row along the second direction;

wherein a depth of a second doped region is greater than or equal to a spacing between the word line gate structure and the second surface of the substrate; and the semiconductor structure also comprises: a plurality of bit line plugs, wherein a bit line plug is disposed between a bit line and a second doped region, and the bit line plug is electrically coupled with a bit line and a second doped region.

19. The semiconductor structure according to claim 13, wherein a second isolation structure is disposed between adjacent active areas, and the second isolation structure is exposed from the second surface of the substrate; and the semiconductor structure also comprises: a first dielectric layer disposed on the second surface of the substrate and on the second isolation structure, wherein a plurality of third recesses are formed in the first dielectric layer, an active area is exposed from a third recess, and a bit line is disposed in the third recess;

wherein the bit line comprises: a barrier layer disposed on a side wall and a bottom surface of the third recess, and a bit line layer disposed on the barrier layer.

20. The semiconductor structure according to claim 13, further comprising:

a second dielectric layer disposed on the first isolation structure and on an active area exposed from the first surface of the substrate, wherein a capacitor structure is disposed in the second dielectric layer.

21. The semiconductor structure according to claim 13, wherein each of the capacitor structures is disposed on an active area adjacent to the second side wall.

* * * * *